(12) United States Patent
Ikeda et al.

(10) Patent No.: US 7,999,259 B2
(45) Date of Patent: Aug. 16, 2011

(54) DISPLAY DEVICE HAVING A PHOTODIODE WHOSE P REGION HAS AN EDGE WIDTH DIFFERENT THAN THAT OF THE N REGION

(75) Inventors: Masanobu Ikeda, Kanagawa (JP); Ryoichi Ito, Kanagawa (JP); Daisuke Takama, Kanagawa (JP); Kenta Seki, Kanagawa (JP); Natsuki Otani, Kanagawa (JP)

(73) Assignee: Sony Corporation, Tokyo (JP)

( * ) Notice: Subject to any disclaimer, the term of this patent is extended or adjusted under 35 U.S.C. 154(b) by 274 days.

(21) Appl. No.: 12/331,262

(22) Filed: Dec. 9, 2008

(65) Prior Publication Data
US 2009/0159901 A1    Jun. 25, 2009

(30) Foreign Application Priority Data

Dec. 19, 2007 (JP) ................................ 2007-328065
Oct. 24, 2008 (JP) ................................ 2008-274546

(51) Int. Cl.
*H01L 31/14* (2006.01)

(52) U.S. Cl. ............ 257/59; 257/84; 257/458; 257/460; 257/465; 257/72; 257/233; 257/291; 257/292; 257/E33.076; 257/E31.058; 257/E31.096; 257/E27.133; 257/E25.032

(58) Field of Classification Search .......................... None
See application file for complete search history.

(56) References Cited

U.S. PATENT DOCUMENTS
2005/0045881 A1* 3/2005 Nakamura et al. .............. 257/59

FOREIGN PATENT DOCUMENTS
JP    2005-275644    10/2005
JP    2007-241303    9/2007

* cited by examiner

*Primary Examiner* — Minh-Loan T Tran
*Assistant Examiner* — Fei Fei Yeung Lopez
(74) *Attorney, Agent, or Firm* — Robert J. Depke; Rockey, Depke & Lyons, LLC

(57) ABSTRACT

A display includes: a substrate having a pixel region and a sensor region in which photo-sensor parts are formed; an illuminating section operative to illuminate the substrate from one surface side of the substrate; a thin film photodiode disposed in the sensor region, having at least a P-type semiconductor region and an N-type semiconductor region, and operative to receive light incident from the other surface side of the substrate; and a metallic film formed on the one surface side of the substrate so as to face the thin film photodiode through an insulator film, operative to restrain light generated from the illuminating section from being directly incident on the thin film photodiode from the one surface side, and fixed to a predetermined potential, wherein in the thin film photodiode, the width of the P-type semiconductor region and the width of the N-type semiconductor region are different from each other.

20 Claims, 25 Drawing Sheets

36A···P-TYPE SEMICONDUCTOR REGION
36K···N-TYPE SEMICONDUCTOR REGION
Wp···WIDTH OF P-TYPE SEMICONDUCTOR REGION
Wn···WIDTH OF N-TYPE SEMICONDUCTOR REGION
38···METALLIC FILM

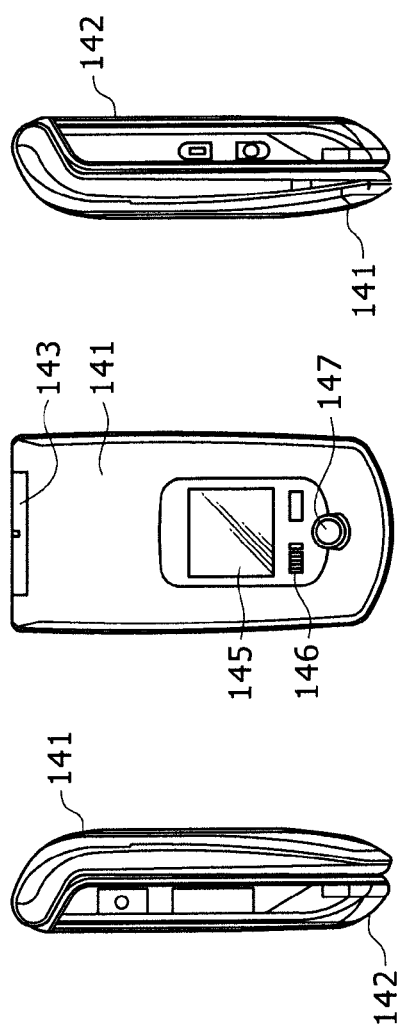

DISPLAY DEVICE HAVING A PHOTODIODE WHOSE P REGION HAS AN EDGE WIDTH DIFFERENT THAN THAT OF THE N REGION

CROSS REFERENCES TO RELATED APPLICATIONS

The present invention contains subject matter related to Japanese Patent Applications JP 2007-328065 and 2008-274546, filed in the Japan Patent Office on Dec. 19, 2007 and Oct. 24, 2008, respectively, the entire contents of which being incorporated herein by reference.

BACKGROUND OF THE INVENTION

1. Field of the Invention

The present invention relates to a display including a substrate (display section) having a pixel region in which pixels are formed and a sensor region in which light receiving elements are formed. More particularly, the invention relates to a technology for enhancing the light utilization efficiency in the process in which light reflected by an object to be detected, coming into contact with or into proximity to the substrate (display section), is received by a plurality of light receiving elements.

2. Description of the Related Art

As display devices for use in mobile phones, personal digital assistants (PDA), digital still cameras, PC (personal computer) monitors, television sets, etc., there have been known liquid crystal displays, organic EL (electroluminescence) displays, displays using the electrophoretic method, and so on.

Attendant on the reductions in the thickness of displays, there has come to be a demand for a display having a multiplicity of functions, i.e., having the function of, for example, an inputting device for inputting user's instructions and the like in addition to the original function of displaying pictures, character information, etc. As a device to meet the demand, there has been known a display which detects that a user's finger or a stylus pen (so-called touch pen) has come into contact with or proximity to the display screen.

Detection of the contact can be carried out, for example, by a touch panel based on a resistance film system or a capacitance (electrostatic capacity) system. There has been known a display in which a touch panel added to the display surface side of a display panel such as a liquid crystal panel.

However, the addition of a touch panel is disadvantageous from the viewpoint of thinning the display panel, and causes a rise in cost. Especially, the resistance film system touch panel has the problem that the change in resistance value can be detected only when the screen is pressed with a certain degree of strength, which results in distortion of the display screen. Besides, the resistance film system touch panel is of one-point detection type in principle, and therefore has limited use.

In recent years, there is a movement in regard of liquid crystal displays toward the provision of a touch panel function by adopting a configuration in which photo-sensors are also formed on a transistor array substrate for controlling the driving voltage for the liquid crystal.

In relation to the display having photo-sensors on a transistor array substrate, several detecting methods have been known, for example, a method in which a finger or a stylus pen is recognized by detecting its shadow under external light, and a method in which back-light light (light from a back light) is reflected by a finger or a stylus and the reflected light is detected.

However, the method in which the finger or stylus pen is recognized by detecting its shadow under external light has the problem that the function is not attained in the dark. On the other hand, the method in which the back-light light is reflected by the finger or stylus and the reflected light is detected has the problem that detection is impossible in the case of displaying of perfect black.

Under such circumstances, Japanese Patent Laid-Open No. 2005-275644 (hereinafter referred to as Patent Document 1) proposes a liquid crystal display in which infrared light is emitted from a back light and the reflected infrared light is detected.

On the other hand, Japanese Patent Laid-Open No. 2007-241303 (hereinafter referred to as Patent Document 2) proposes a liquid crystal display in which a reflector is provided under a semiconductor layer formed from polysilicon constituting a PIN-type (p-intrinsic-n type) diode and light is reflected by the semiconductor layer so that the light absorption length is increased.

SUMMARY OF THE INVENTION

However, in the liquid crystal display described in Patent Document 1, there is a material-basis problem in the case of an attempt to realize an infrared sensor with a thin film of polycrystalline silicon in that the absorbance is lowered in the infrared region as compared with that in the visible region as shown in FIG. 1, so that the detection intended is difficult to achieve. Further, since a visible-light source is used as the back-light light source, there is the problem that upon incidence of visible light corresponding to a higher photo-sensitivity on the photodiode, the infrared signal to be detected would be buried in noise.

On the other hand, in the liquid crystal display described in Patent Document 2, there is the problem that although the light output is increased, the sensitivity would not be increased unless a special contrivance is made as to the capacitance on the detection side.

Besides, an improvement in the saturation characteristics of the sensor as well as an enhancement of the sensor sensitivity is being demanded.

In addition, these problems are not limited to the cases of the liquid crystal displays described in Patent Documents 1 and 2 but are related also to other displays such as organic EL displays and displays using electrophoresis.

Thus, there is a need to enhance the detection sensitivity of the above-mentioned sensors and to improve the saturation characteristics of the sensors.

According to one embodiment of the present invention, there is provided a display including: a substrate having a pixel region in which pixels are formed and a sensor region in which photo-sensor parts are formed; an illuminating section operative to illuminate the substrate from one surface side of the substrate; a thin film photodiode disposed in the sensor region, having at least a P-type semiconductor region and an N-type semiconductor region, and operative to receive light incident from the other surface side of the substrate; and a metallic film formed on the one surface side of the substrate so as to face the thin film photodiode through an insulator film therebetween, operative to restrain light generated from the illuminating section from being directly incident on the thin film photodiode from the one surface side, and fixed to a predetermined potential, wherein in the thin film photodiode, the width of the P-type semiconductor region in a direction perpendicular to the direction of connection to the N-type semiconductor region and the width of the N-type semiconductor region in the direction perpendicular to the direction of connection to the P-type semiconductor region are different from each other.

The display according to the one embodiment of the present invention has the substrate, the illuminating section, the thin film photodiode, and the metallic film.

The substrate has the pixel region in which pixels are formed and the sensor region in which photo-sensor parts are formed.

The illuminating section illuminates the substrate from the one surface side of the substrate.

The thin film photodiode is disposed in the sensor region, has at least a P-type semiconductor region and an N-type semiconductor region, and is operative to receive light incident from the other surface side of the substrate.

The metallic film is formed on the one surface side of the substrate so as to face the thin film photodiode through an insulator film therebetween, is operative to restrain the light generated from the illuminating section from being directly incident on the thin film photodiode from the one surface side, and is fixed to a predetermined potential.

Here, in the thin film photodiode, a layout is adopted such that the width of the P-type semiconductor region in a direction perpendicular to the direction of connection to the N-type semiconductor region is different from the width of the N-type semiconductor region in the direction perpendicular to the direction of connection to the P-type semiconductor region.

According to an another embodiment of the present invention, there is provided a display including: a substrate having a pixel region in which pixels are formed and a sensor region in which photo-sensor parts are formed; an illuminating section operative to illuminate the substrate from one surface side of the substrate; a thin film photodiode disposed in the sensor region, having at least a P-type semiconductor region and an N-type semiconductor region, and operative to receive light incident from the other surface side of the substrate; and a metallic film formed on the one surface side of the substrate so as to face the thin film photodiode through an insulator film therebetween, operative to restrain light generated from the illuminating section from being directly incident on the thin film photodiode from the one surface side, and fixed to a predetermined potential, wherein in the thin film photodiode and the metallic film, the capacitance value of a parasitic capacitance including the P-type semiconductor region and the metallic film which face each other through the insulator film therebetween is different from the capacitance value of a parasitic capacitance including the N-type semiconductor region and the metallic film which face each other through the insulator film therebetween.

The display according to the another embodiment of the present invention has the substrate, the illuminating section, the thin film photodiode, and the metallic film.

The substrate has the pixel region in which pixels are formed and the sensor region in which photo-sensor parts are formed.

The illuminating section illuminates the substrate from the one surface side of the substrate.

The thin film photodiode is disposed in the sensor region, has at least a P-type semiconductor region and an N-type semiconductor region, and is operative to receive light incident from the other surface side of the substrate.

The metallic film is formed on the one surface side of the substrate so as to face the thin film photodiode through an insulator film therebetween, is operative to restrain the light generated from the illuminating section from being directly incident on the thin film photodiode from the one surface side, and is fixed to a predetermined potential.

Here, in the thin film photodiode and the metallic film, the capacitance value of the parasitic capacitance including the P-type semiconductor region and the metallic film which face each other through the insulator film therebetween is different from the capacitance value of the parasitic capacitance including the N-type semiconductor region and the metallic film which face each other through the insulator film therebetween.

According to a further embodiment of the present invention, there is provided a display including: a substrate having a pixel region in which pixels are formed and a sensor region in which photo-sensor parts are formed; an illuminating section operative to illuminate the substrate from one surface side of the substrate; a thin film photodiode disposed in the sensor region, having at least a P-type semiconductor region and an N-type semiconductor region, and operative to receive light incident from the other surface side of the substrate; and a metallic film formed on the one surface side of the substrate so as to face the thin film photodiode through an insulator film therebetween, operative to restrain light generated from the illuminating section from being directly incident on the thin film photodiode from the one surface side, and fixed to a predetermined potential, wherein in the thin film photodiode, the area of an overlapping region of the P-type semiconductor region and the metallic film as viewed from one of the one surface side and the other surface side is different from the area of an overlapping region of the N-type semiconductor region and the metallic film.

The display according to the further embodiment of the present invention has the substrate, the illuminating section, the thin film photodiode, and the metallic film.

The substrate has the pixel region in which pixels are formed and the sensor region in which photo-sensor parts are formed.

The illuminating section illuminates the substrate from the one surface side of the substrate.

The thin film photodiode is disposed in the sensor region, has at least a P-type semiconductor region and an N-type semiconductor region, and is operative to receive light incident from the other surface side of the substrate.

The metallic film is formed on the one surface side of the substrate so as to face the thin film photodiode through an insulator film therebetween, is operative to restrain the light generated from the illuminating section from being directly incident on the thin film photodiode from the one surface side, and is fixed to a predetermined potential.

Here, in the thin film photodiode, the area of the overlapping region of the P-type semiconductor region and the metallic film as viewed from one of the one surface side and the other surface side is different from the area of the overlapping region of the N-type semiconductor region and the metallic film.

According to the display pertaining to the one embodiment of the present invention, in the thin film photodiode formed in the sensor region of the substrate, the width of the P-type semiconductor region and the width of the N-type semiconductor region are different from each other. This makes it possible to reduce the parasitic capacitance between the thin film photodiode and the metallic film, to enhance the detection sensitivity of the sensors, and to improve the saturation characteristics of the sensors.

In addition, according to the display pertaining to the another embodiment of the present invention, the capacitance value of the parasitic capacitance including the P-type semiconductor region and the metallic film facing each other through the semiconductor film therebetween is different from the capacitance value of the parasitic capacitance including the N-type semiconductor region and the metallic film facing each other through the insulator film therebetween. This makes it possible to reduce the parasitic capacitance between the thin film photodiode and the metallic film, to enhance the detection sensitivity of the sensors, and to improve the saturation characteristics of the sensors.

Further, according to the display pertaining to the further embodiment of the present invention, the area of the overlapping region of the P-type semiconductor region and the metallic film as viewed from one of the one surface side and the other surface side is different from the area of the overlapping region of the N-type semiconductor region and the metallic film. This results in a configuration in which the capacitance value of a parasitic capacitance including the P-type semiconductor region and the metallic film facing each other through the insulator film therebetween is different from the capacitance value of a parasitic capacitance including the N-type semiconductor region and the metallic film facing each other through the insulator film therebetween, whereby it is possible to reduce the parasitic capacitance between the thin film photodiode and the metallic film, to enhance the detection sensitivity of the sensors, and to improve the saturation characteristics of the sensors.

BRIEF DESCRIPTION OF THE DRAWINGS

FIGS. 27A and 27B illustrate a digital camera as a second application example according to the fifth embodiment of the invention, wherein FIG. 27A is a perspective view from the face side, and FIG. 27B is a perspective view from the back side;

FIGS. 30A to 30G illustrate a mobile phone as a fifth application example according to the fifth embodiment of the invention, wherein FIG. 30A is a front view of the mobile phone in an opened state, FIG. 30B is a side view of the same, FIG. 30C is a front view of the mobile phone in a closed state, FIG. 30d is a left side view of the same, FIG. 30E is a right side view of the same, FIG. 30F is a top view of the same, and FIG. 30G is a bottom view of the same.

DETAILED DESCRIPTION OF THE PREFERRED EMBODIMENTS

Figure 1:
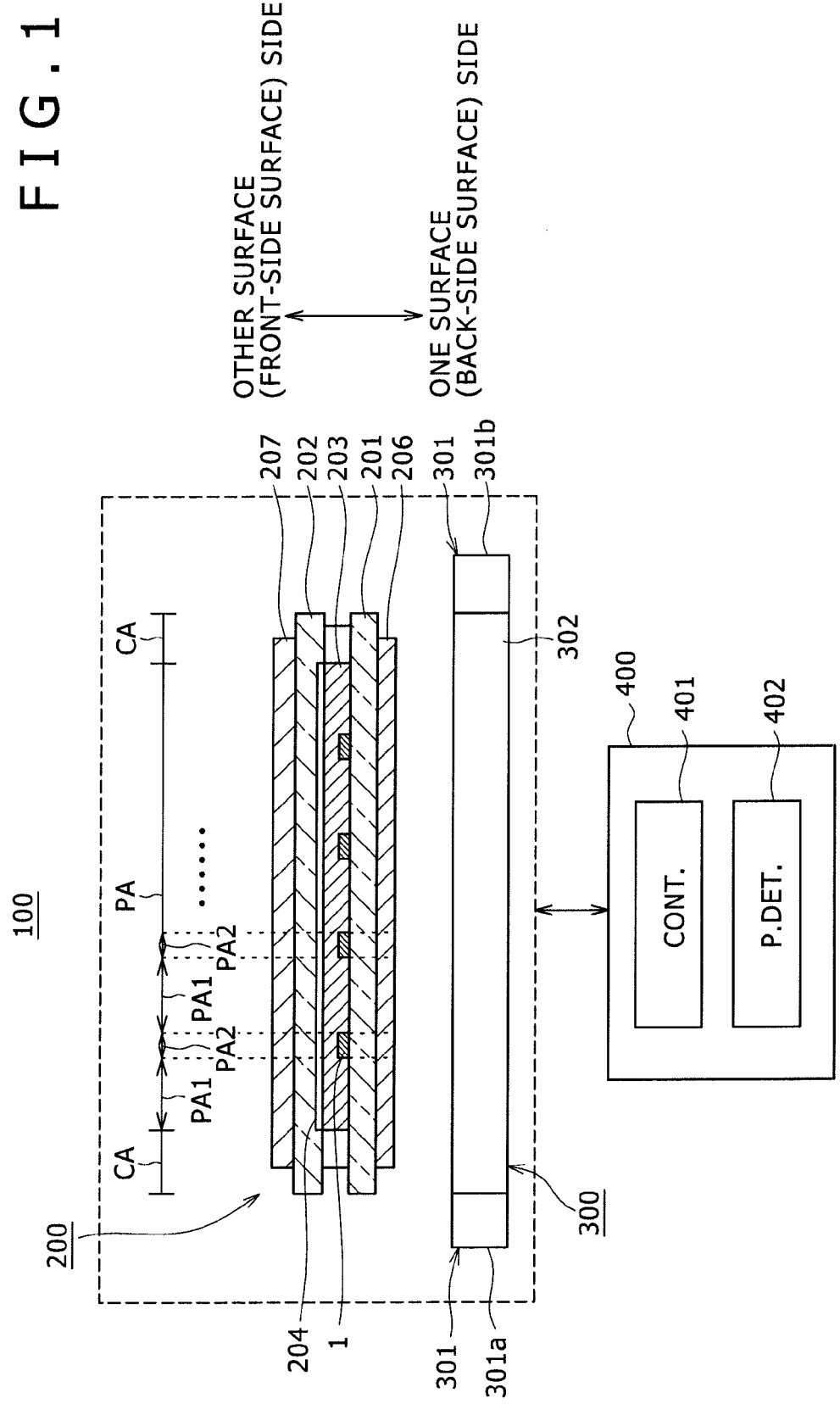
FIG. 1 is a schematic, general configuration diagram of a liquid crystal display according to a first embodiment of the present invention.

Now, displays according to embodiments of the present invention will be described below referring to the drawings.

Incidentally, description will be made in the following order.

(1) First Embodiment (a configuration in which the width of an anode region in a direction perpendicular to the direction of connection with a cathode region is different from the width of the cathode region in the direction perpendicular to the direction of connection to the anode region)

(2) Modified Example (3) Second Embodiment (a configuration in which the exterior of an overlapping region with a control gate is provided with an extension part extending in a direction perpendicular to the direction of connection to the cathode region)

(4) Third Embodiment (a configuration in which an I-region is provided, at an end part of an anode region, with an I-region part having the same width as the width of the anode region)

(5) Fourth Embodiment (a configuration in which the width of overlap of a P$^+$ region with a control gate is smaller than the width of overlap of an N$^+$ region with the control gate)

(6) Fifth Embodiment (a product example to which the display is applied)

First Embodiment

Now, a display according to a first embodiment of the present invention will be described below, taking a liquid crystal display as an example and referring to the drawings.

The display in the present embodiment is preferably applicable to a liquid crystal display of the so-called "transmission type" in which light is cast from the back-side surface side (the side of a surface on the opposite side of a front-side surface for displaying images thereon). Therefore, the following description is based on the assumption that the liquid crystal display is of the transmission type.

(General Configuration)

FIG. 1 is a schematic general configuration diagram of a transmission-type liquid crystal display.

The liquid crystal display 100 illustrated in FIG. 1 has, for example, a liquid crystal panel 200 which is a display section as "substrate," a back light 300 as "illuminating section," and a data processing section 400.

For example as shown in FIG. 1, the liquid crystal panel 200 has a TFT (thin film transistor) array substrate 201, a color filter substrate 202 as a so-called "opposite (counter) substrate," and a liquid crystal layer 203. Hereinafter, with the liquid crystal layer 203 as a center (or reference), the side of the back light 300 in the thickness direction of the liquid crystal panel 200 will be referred to as "one surface side" or "the back-side surface side," whereas the side opposite to the one surface side will be referred to as "the other surface side" or "the front-side surface side."

For example, the TFT array substrate 201 and the color filter substrate 202 are opposed to each other with a spacing therebetween, and the liquid crystal layer 203 is so formed as to be interposed between the TFT array substrate 201 and the color filter substrate 202. In addition, though not especially shown in the figure, orientation films for aligning the liquid crystal molecules in the liquid crystal layer 203 in an orientation direction are formed in pair so as to sandwich the liquid crystal layer 203 therebetween. A color filter 204 is formed at that surface of the color filter substrate 202 which is on the side of the liquid crystal layer 203.

For example, a first polarizing plate 206 and a second polarizing plate 207 are disposed respectively on both sides of the liquid crystal panel 200 so as to be opposed to each other. Specifically, the first polarizing plate 206 is disposed on the back-side surface side of the TFT array substrate 201, and the second polarizing plate 207 is disposed on the front-side surface side of the color filter substrate 202.

For example, photo-sensor parts 1 are provided on the other surface side of the TFT array substrate 201 which faces the liquid crystal layer 203, as shown in FIG. 1. The photo-sensor parts 1, which will be detailed later, each include a thin film photodiode as a light receiving element and a reading circuit thereof.

The photo-sensor parts 1 are formed in order to provide the function of the so-called touch panel in the liquid crystal panel 200. For example, when the liquid crystal panel 200 is viewed from the side of the display surface (front-side surface), the photo-sensor parts 1 are regularly arranged within an effective display region PA.

FIG. 1 shows a section of the liquid crystal panel 200 in which the photo-sensor parts 1 are arranged in a matrix pattern within the effective display region PA. In FIG. 1, for example, a plurality of (in the drawing, four) photo-sensor parts 1 are arranged at regular intervals. While FIG. 1 shows four photo-sensor parts 1 for convenience, this configuration is not limitative.

In the case where the position-detecting function is limited to a part of the effective display region PA, for example, the photo-sensor parts 1 are regularly arranged in the limited display region.

In the effective display region PA of the display plane (front-side surface), as shown in FIG. 1, those regions of the liquid crystal panel 200 in which the photo-sensor parts 1 are formed are each defined as "sensor region (PA2)," while the other regions of the liquid crystal panel 200 are each defined as "pixel region (PA1)." The pixel regions (PA1) are arrangement regions of pixels to which a plurality of colors, for example, red (R), green (G) and blue (B), are allocated on a pixel basis. The allocation of colors is determined by the transmission wavelength characteristics of color filters which face the pixels, respectively.

For example, though omitted in FIG. 1, a pixel electrode and a common electrode (also called counter electrode) are formed in the pixel arrangement region (pixel region (PA1)). The pixel electrode and the common electrode are each formed from a transparent electrode material. On the other surface side (liquid crystal layer side) of the TFT array substrate 201 and the counter-liquid-crystal side of the pixel electrodes, a common electrode common for all the pixels may in some cases be formed oppositely to the pixel electrodes. Or, alternatively, a configuration may in some cases be adopted in which the pixel electrodes are formed on the other surface side of the TFT array substrate 201, and the common electrode common for all the pixels is formed at a position on the side of the color filter substrate 201, oppositely to the pixel electrodes with the liquid crystal layer 203 therebetween.

In the pixel arrangement region, though not shown in FIG. 1, there are also formed an auxiliary capacitance for assisting the liquid crystal capacitance between the pixel electrode and the counter electrode, a switching element by which a potential impressed on the pixel electrode is controlled according to the potential of a picture signal inputted, and the like, according to the pixel configuration.

For example, when a unit composed of a plurality of pixels corresponding respectively to a plurality of colors in a oneto-one correspondence manner is defined as "pixel unit," the arrangement density of the photo-sensor parts 1 is maximized in the case where the ratio of the number of the photo-sensor parts 1 to the number of the pixel units is 1:1. In the present embodiment, the arrangement density of the photo-sensor parts 1 may be equal to or less than the maximum.

The back light 300 is disposed, for example, on the back-side surface side of the TFT array substrate 201. The back light 300 faces the back-side surface of the liquid crystal panel 200, and emits illuminating light to the effective display region PA of the liquid crystal panel 200.

The back light 300 exemplarily shown in FIG. 1 has light sources 301, and a light guide plate 302 for diffusing the light emitted from the light sources 301 to convert the light into surface light. The back light 300 is classified into a side light type, an underneath type and the like according to the arrangement position(s) of the light source(s) 301 relative to the light guide plate 302; here, a side light type is exemplified.

For example, on the back side of the liquid crystal panel 200, the light source or source 301 is or are arranged on one or both sides in the direction along the back-side surface of the liquid crystal panel 200. In other words, the light source or sources 301 is or are arranged along one edge or two opposite edges of the liquid crystal panel 200, as viewed from the side of the display surface 200A (front-side surface). It is to be noted here, however, that the light sources 301 may be arranged along three or more edges of the liquid crystal panel 200.

The light source 301 is composed, for example, of a cold-cathode tube lamp in which UV rays generated by arc discharge in a low-pressure mercury vapor in a glass tube are converted by a fluorescent material into visible rays and the visible rays are emitted, or of LEDs (light emitting diodes), EL elements or the like. FIG. 1 shows a case where a visible light source 301a such as white LEDs and an IR (infrared) light source 301b are arranged respectively along two opposite edges, as the light sources 301.

The light guide plate 302 is composed, for example, of a light-transmitting acrylic resin plate, and guides the light from each light source 301 along the planes thereof while effecting total reflection (from one side toward the other side along the back-side surface of the liquid crystal panel 200). The light guide plate 302 is provided at its back-side surface with a dot pattern (a plurality of projections) (not shown) which are, for example, formed as parts of the light guide plate 302 or composed of members separate from the light guide plate 302. The guided light is scattered by the dot pattern, to be cast on the liquid crystal panel 200. Incidentally, a reflective sheet for reflecting light may be provided on the back-side surface side of the light guide plate 302, and a diffusing sheet or a prism sheet may be provided on the front-side surface side of the light guide plate 302.

For instance, the back light 300 is configured as above, and radiates surface light which is substantially uniform over the whole area of the effective display region PA of the liquid crystal panel 200.

In addition, for example, the data processing section 400 has a control block 401 and a position detecting block 402, as shown in FIG. 1. The data processing section 400 includes a computer, and operates through a process in which the computer controls various parts or sections according to a program(s). Therefore, the functions of the control block 401 and the position detecting block 402 are realized by use of program tasks and data which are preliminarily stored in a memory or memories (not shown) or are inputted externally. The data processing section 400 may have its functions mounted divisionally on the basis of the inside and the outside of the liquid crystal panel 200. FIG. 1 shows a case where the data processing section 400 is arranged, for example, as a single IC (integrated circuit) or a plurality of ICs, in the exterior of the liquid crystal panel 200.

For example, the control block 401 performs control of image display, control of the IR sensors for position detection (data collection by light reception), and control of the back light.

As to the image display, for example, the control block 401 supervisorily gives instructions to a display driving circuit in the liquid crystal panel 200, thereby controlling the image display in the liquid crystal panel 200. As for the control of the IR sensors, for example, the control block 401 supervisorily gives instructions to a sensor driving circuit in the liquid crystal panel 200, thereby controlling the detection of the position (and the size) of an object to be detected. Examples of the display driving circuit and the sensor driving circuit will be described later.

As for the control of the back light, the control block 401 supplies a control signal to a power source section (not shown) of the back light 300, thereby controlling the brightness of the illuminating light outputted from the back light 300 and the like.

For example, upon receiving an instruction from the control block 401, the position detecting block 402 detects the contacting or approaching position of the object, such as a user's finger or a stylus pen, based on the light reception data sent through the sensor driving circuit in the liquid crystal panel 200. This detection is performed with respect to the effective display region PA of the liquid crystal panel 200.

(Schematic Configuration of Liquid Crystal Panel)

Figure 2:
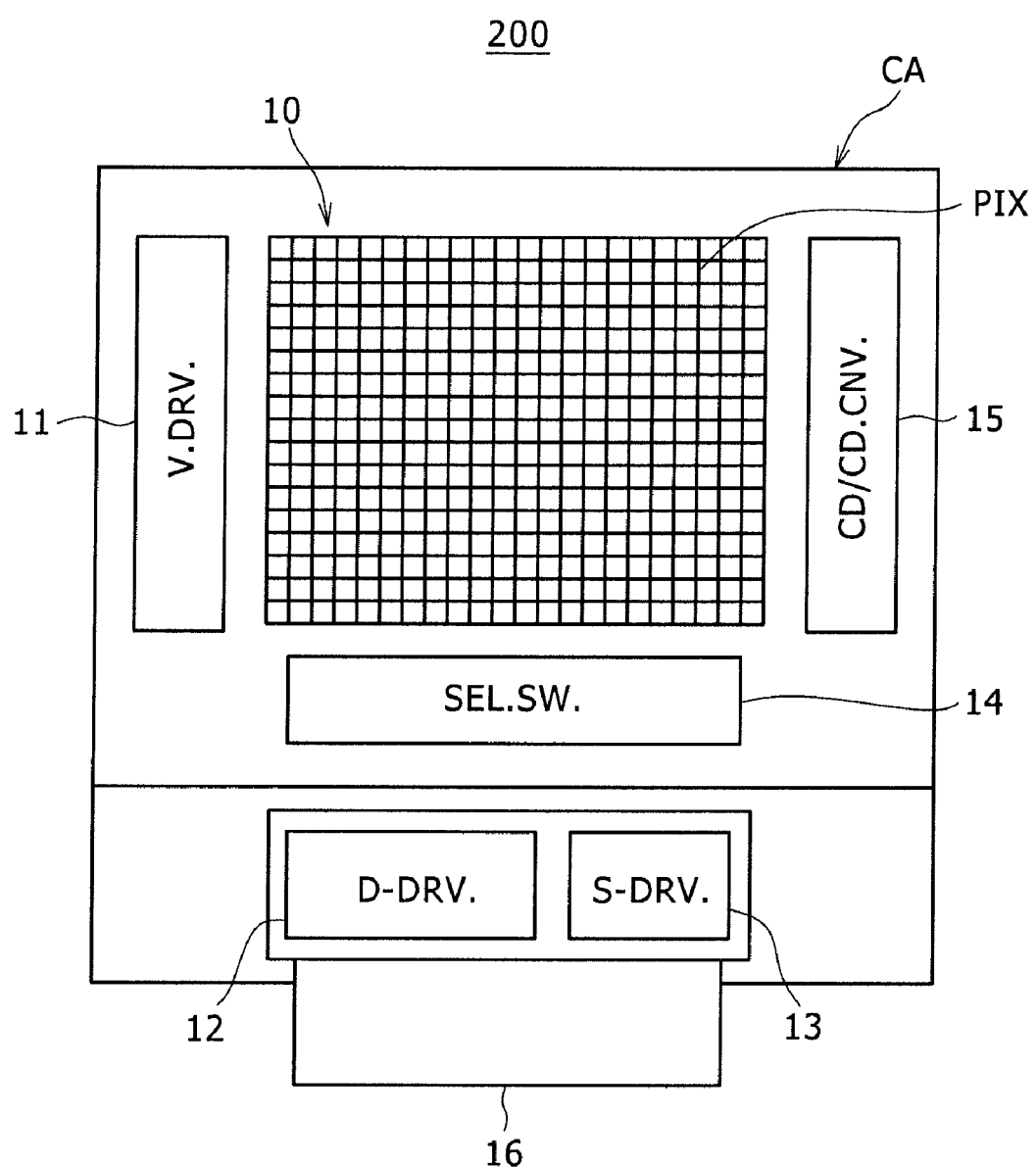
FIG. 2 is a block diagram showing the configuration of a driving circuit in the liquid crystal display according to the first embodiment of the invention.

FIG. 2 is a block diagram showing a configuration example of the driving circuits in the liquid crystal panel.

As shown in FIG. 2, for example, the liquid crystal panel 200 has a display section 10 in which pixels (PIX) are arranged in a matrix pattern.

As shown in FIG. 1 also, a peripheral region CA is present in the periphery of the effective display region PA. The peripheral region CA refers to the region other than the effective display region PA, of the TFT array substrate 201. As shown in FIG. 2, driving circuits represented by several functional blocks including TFTs formed collectively with the TFTs in the effective display region PA are formed in the peripheral region CA.

The liquid crystal panel 200, for example, has a vertical driver (V.DRV.) 11, a display driver (D-DRV.) 12, a sensor driver (S-DRV.) 13, a selecting switch array (SEL.SW.) 14, and a DC-DC converter (DC/DC.CNV.) 15.

For instance, the vertical driver 11 is a circuit which has the function of a shift register or the like for scanning in the vertical direction a variety of control lines laid in the horizontal direction, so as to select the pixel line(s).

The display driver 12 is a circuit which has, for example, the function to generate a data signal amplitude by sampling the data potential of a picture signal and to discharge the data signal amplitude to a signal line common to the pixels in the column direction.

The sensor driver 13 is a circuit which applies scanning of the control lines, like that of the vertical driver 11, to the photo-sensor parts 1 dispersely arranged in a predetermined density in the pixel arrangement region and performs collection of sensor outputs (detection data) synchronously with the scanning of the control lines.

The switch array 14 is a control circuit which includes a plurality of TFT switches and which performs control of discharge of the data signal amplitude by the display driver 12 and control of the sensor outputs from the display section 10.

The DC-DC converter 15 is a circuit which generates a variety of DC (direct current) voltages at potentials necessary for driving the liquid crystal panel 200, from a power source voltage inputted.

For example, transfer of input/output signals to and from the display driver 12 and the sensor driver 13 and other signals between the inside and the outside of the liquid crystal panel 200 is carried out through a flexible substrate 16 provided for the liquid crystal panel 200.

Other than the components shown in FIG. 2, for example, configurations for generating or externally inputting a clock signal and the like are also included in the driving circuits.

(Combination Example of Pixels with Photo-Sensor Parts)

As has been above-mentioned, for example, the pixels and the photo-sensor parts are arranged regularly in the effective display region PA. The regularlity of the arrangement is arbitrary; for example, a plurality of sets each of which is composed of a plurality of pixels and one photo-sensor part may be arranged in a matrix within the effective display region PA. For instance, each of the sets is composed of three pixels (R, G and B pixels) and one photo-sensor part.

The color filter 204 shown in FIG. 1, for example, has filters each of which corresponds substantially the size in plan view of the pixel and selectively transmits light in each of the R, G and B wavelength regions, and a black matrix which shields the peripheries (all the boundary parts) of the filters in a fixed width for preventing color mixture.

(Patterns and Sectional Structures of Pixel Part and Photo-Sensor Part)

Figure 3A:
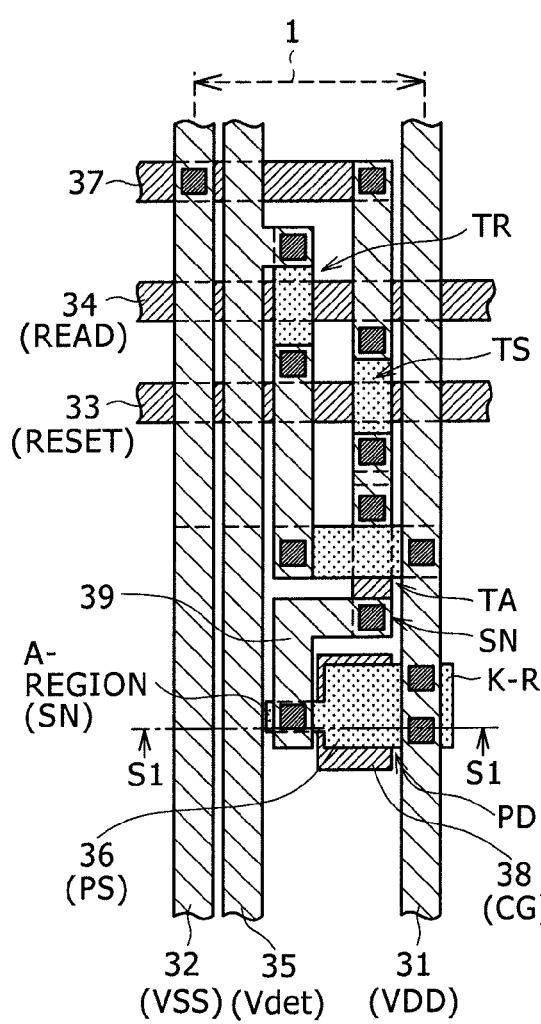
FIG. 3A is a plan view of a photo-sensor part provided in the liquid crystal display according to the first embodiment of the invention.
Figure 3B:
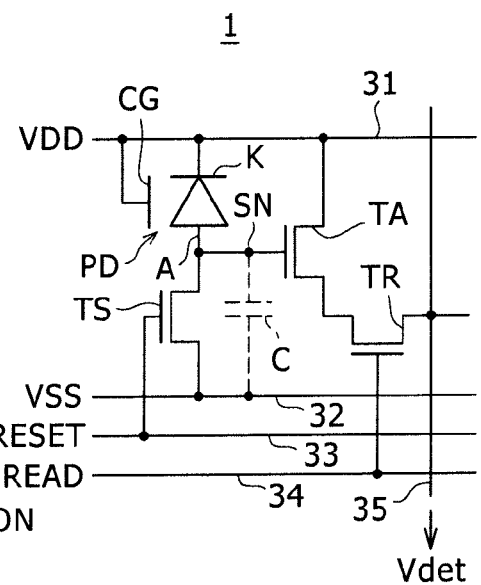
FIG. 3B is an equivalent circuit diagram of the photo-sensor part corresponding to the pattern in FIG. 3A.

FIG. 3A shows an example of plan view of a photo-sensor part 1, and FIG. 3B shows an example of an equivalent circuit of the photo-sensor part 1 corresponding to the pattern shown in FIG. 3A.

For example, as illustrated in FIG. 3B, the photo-sensor part 1 includes three transistors composed of N-channel type thin film transistors (TFT), and a thin film photodiode PD as a light receiving element.

The three transistors are a reset transistor TS, an amplifying transistor TA, and a reading transistor TR.

The thin film photodiode PD, for example, is formed as a light receiving element having sensitivity to non-visible light such as infrared (IR) light and ultraviolet (UV) light. In the present embodiment, the thin film photodiode PD is a light receiving element having sensitivity to infrared light emitted by an IR light source 301b constituting the back light 300 mentioned above. In the case where the back light emits ultraviolet light, the thin film photodiode PD is designed to have sensitivity to the ultraviolet light.

Of the thin film photodiode PD, for example, the anode is connected to a storage node SN, and the cathode is connected to a supply line (hereinafter referred to as "VDD line") 31 of a power source voltage VDD.

The thin film photodiode PD has a PIN structure or a PDN structure as will be described later, and has a control gate CG for applying an electric field to an I (intrinsic) region (an intrinsic semiconductor region of the PIN structure) or a D (doped) region (an $N^-$ region of the PDN structure) through an insulator film. The thin film photodiode PD has such a structure that it is used in the state of being reverse biased, and the sensitivity can be optimized (usually, maximized) by controlling the degree of depletion in that instance by the control gate CG.

Of the reset transistor TS, for example, the drain is connected to the storage node SN, the source is connected to a supply line (hereinafter referred to as "VSS line") 32 of a reference voltage VSS, and the gate is connected to a supply line (hereinafter referred to as "reset line") 33 of a reset signal (RESET). The reset transistor TS switches the storage node SN from a floating state to a state of being connected to the VSS line 32 so as to discharge the storage node SN, thereby resetting the amount of charge stored therein.

Of the amplifying transistor TA, for example, the drain is connected to the VDD line 31, the source is connected to an output line (hereinafter referred to as "detection line") of a detection potential Vdet (or a detection current Idet) through the reading transistor TR, and the gate is connected to the storage node SN.

Of the reading transistor TR, for example, the drain is connected to the source of the amplifying transistor TA, the source is connected to the detection line 35, and the gate is connected to a supply line (hereinafter referred to as "read control line") 34 of a read control signal (READ).

The amplifying transistor TA, for example, has such a function that when a positive charge generated in the thin film photodiode PD is stored in the storage node SN put again into the floating state after being reset, the amplifying transistor TA amplifies the thus stored charge (light reception potential). The reading transistor TR is a transistor for controlling the timing with which the light reception potential amplified by the amplifying transistor TA is discharged to the detection line 35. When a predetermined storage time has elapsed, the read control signal (READ) is activated and the reading transistor TR is turned ON, so that a voltage is impressed on the source and drain of the amplifying transistor TA, which passes a current according to the gate potential at that moment. As a result, a potential change increased in amplitude according to the light reception potential appears on the detection line 35, and the potential change is outputted as the detection potential Vdet from the detection line 35 to the exterior of the photo-sensor part 1. Or, alternatively, the detection current Idet the value of which varies according to the light reception potential is outputted from the detection line 35 to the exterior of the photo-sensor part 1.

FIG. 3A shows a top plan view of a TFT array substrate 201 before being adhered to the color filter substrate 202 as shown in FIG. 1 to seal a liquid crystal therebetween.

In the pattern diagram shown in FIG. 3A, the elements and node shown in FIG. 3B are denoted by the same symbols as used in FIG. 3B, so that electrical connections between the elements are clearly seen.

For example, the VDD line 31, the VSS line 32 and the detection line 35 are each formed of an aluminum (AL) wiring layer, whereas the reset line 33 and the read control line 34 are each formed of a gate metal (GM), for example, molybdenum (Mo). The gate metal (GM) is formed below the aluminum (AL) wiring layer. Four semiconductor layers such as a poly-silicon (PS) layer are isolatedly arranged on the upper side of the layer of the gate metal (GM) and on the lower side of the layer of aluminum (AL). Each of the reset transistor TS, the reading transistor TR, the amplifying transistor TA and the thin film photodiode PD has a semiconductor layer such as a PS layer.

In a transistor, for example, a transistor structure is formed in which an N-type impurity is introduced into the one side and the other side of a portion of a thin film semiconductor layer composed, for example, of a PS layer intersecting the gate metal (GM) so as to form a source and a drain.

On the other hand, in a thin film photodiode PD, P-type and N-type impurities of the opposite conduction types are introduced into the one side and the other side of the thin film semiconductor layer 36 composed, for example, of a PS layer, thereby forming a diode structure. A P-type impurity region ($P^+$ region) forms an anode region (A-region), which constitutes the storage node SN, for example. On the other hand, an N-type impurity region (N+ region) forms a cathode region (K-region) of the thin film photodiode PD, which is connected to the VDD line 31 on the upper side through a contact, for example.

Figure 4:
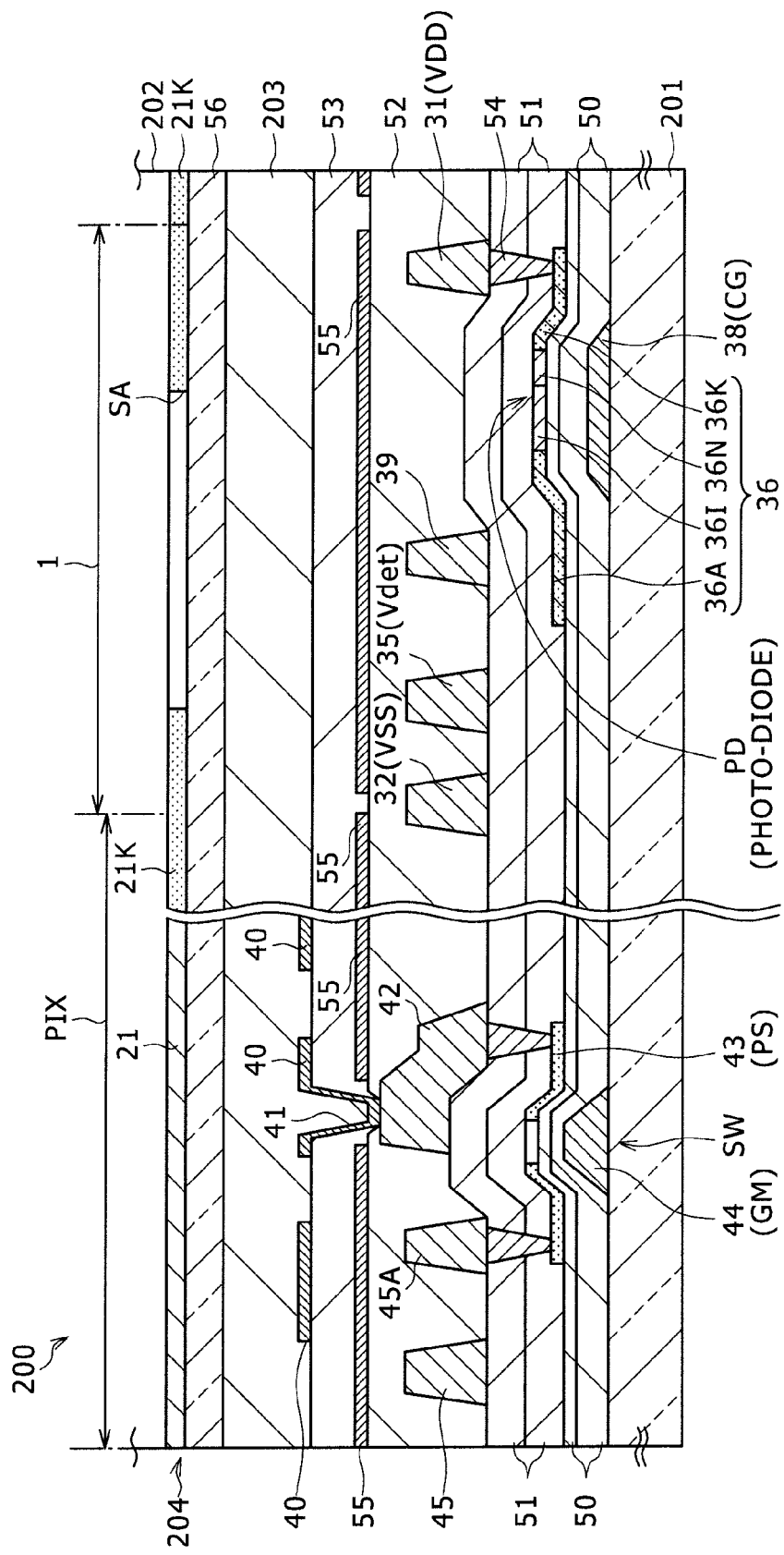
FIG. 4 is a sectional view schematically showing a photo-sensor part provided in the liquid crystal display according to the first embodiment of the invention and a part of a pixel in a liquid crystal of an FFS (Field Fringe Switching) system.

FIG. 4 is a sectional view schematically showing the photo-sensor part 1 and a part of a pixel (PIX) in a liquid crystal of the FFS system. FIG. 4 represents a section taken along line S1-S1 of FIG. 3A and showing a part of the photo-sensor part 1, and a section of a part of the pixel (PIX) (not shown).

The pixel in the liquid crystal in the present embodiment, for example, is of the FFS (Field Fringe Switching) system. The liquid crystal of the FFS system is also called the liquid crystal of the "in plane switching (IPS)-Pro" system.

As shown in FIG. 4, the transistor serving as a switching element SW is formed in the state of being buried in a plurality of multi-layer insulator films on the TFT array substrate 201. The insulator films shown in FIG. 4 include a two-layer gate insulator film 50, a two-layer first interlayer insulator film 51, a second interlayer insulator film (planarizing film) 52, and a third interlayer insulator film 53, in this order from the lower side.

For example, a gate metal GM which is formed of molybdenum (Mo) or the like and which is to be a vertical scanning line 44 is formed beneath the gate insulator film 50, and a thin film semiconductor layer 43 including a poly-silicon (PS) layer or the like is formed over the gate insulator film 50.

The semiconductor layer 43 has a structure in which a P⁻ region to be a channel forming region is located on the upper side of the gate metal GM, and N⁺ regions to be source/drain regions are formed on both sides of the P⁻ region, whereby a thin film transistor is configured.

For example, at one of the source and drain regions formed in the semiconductor layer 43, a pixel electrode 40 including a transparent electrode layer sectioned on a pixel basis through an internal wiring 42 and a contact 41 is formed.

In addition, at an interface between the second interlayer insulator film 52 and the third interlayer insulator film 53 on the lower side of the pixel electrode 40, a common electrode 55 is formed so as to face the pixel electrode 40. The common electrode 55 is composed of a transparent electrode layer which is common to all the pixels.

Besides, a signal line 45A formed of aluminum or the like is connected to the other of the source and drain regions formed in the semiconductor layer 43.

In addition, for example, a color filter substrate 202 is stacked on the upper side the TFT array substrate 201, and a liquid crystal layer 203, an orientation (alignment) film 56, and a color filter 204 are located, in this order from the lower side, between both the substrates.

Here, the liquid crystal layer 203 has a nematic liquid crystal.

The common electrode which is fixed in potential to a common potential, and varies an electric field applied to the liquid crystal by a voltage impressed between itself and the pixel electrode 40.

As shown in FIG. 1, a first polarizing plate 206 and a second polarizing plate 207 are provided, in a firm contact state through an adhesive, on the outside surfaces of the TFT array substrate 201 and the color filter substrate 202 and in a crossed-Nicol state.

In addition, examples of the material which can be used for the signal line 45A and the vertical scanning line 44 (gate metal (GM)) include aluminum (Al), molybdenum (Mo), chromium (Cr), tungsten (W), titanium (Ti), lead (Pb), their composite layers (for example, Ti/Al), and their alloy layers.

Now, the sectional structure of the photo-sensor part 1 will be described below.

As shown in FIG. 4, the thin film photodiode PD is formed in the state of being buried in a plurality of multi-layer insulator films including the two gate insulator films 50, the two first interlayer insulator films 51, the second interlayer insulator film (planarizing film) 52, and the third interlayer insulator film 53 on the upper side of the TFT array substrate 201.

For example, a control gate CG as a "metallic film" is formed just under the gate insulator film 50, and a thin film semiconductor layer 36 having poly-silicon or the like is formed over the gate insulator film 50.

The semiconductor layer 36 has a structure in which an I-region (intrinsic semiconductor region) 36I is located over the control gate CG, and an anode region 36A having a P⁺ region (P-type semiconductor region) and a cathode region 36K having an N⁺ region (N-type semiconductor region) are located on both sides of the I-region 36I. Further, in the present embodiment, a low-concentration semiconductor region (N⁻ region) 36N containing an N-type impurity in a low concentration is formed between the I-region 36I and the cathode region 36K. In this manner, a thin film photodiode of the PIN structure having a low-concentration semiconductor region is configured.

In addition, D-region (N⁻ region) is formed instead of I-region in the PDN structure.

The cathode region 36K, for example, is connected to the VDD line 31 formed over the first interlayer insulator film 51, through a contact plug 54 formed in the interlayer insulator film 51. The anode region 36A is connected to a wiring 39 at a portion (not shown), and is connected to the gate electrode of the amplifying transistor TA.

In addition, over the first interlayer insulator film 51, the detection line 35 and the VSS line 32 are arranged side by side, at a location remote from the VDD line 31.

For example, since all of the VDD line 31, the VSS line 32, and the detection line 35 are formed of aluminum or the like and they have large steps, the second interlayer insulator film (planarizing film) 52 for planarizing the steps is formed.

The common electrode 55 fixed in potential to the common potential is formed over the second interlayer insulator film 52. Since the photo-sensor part 1 lacks the pixel electrode, the electric field applied to the liquid crystal cannot be controlled there, but there is obtained the role of fixing the liquid crystal by the common electrode 55. The common electrode 55 is composed of a transparent electrode layer and, hence, can transmit light therethrough.

In FIG. 4, the color filter 204 is provided with a black matrix 21K at the boundary part between the photo-sensor part 1 and the pixel (PIX), with a sensor aperture SA opened between the two black matrices 21K. On the other hand, in the pixel (PIX), one of R, G and B filters is shown.

(Structure and Light Reception Characteristics of Thin Film Photodiode)

Figure 5A:
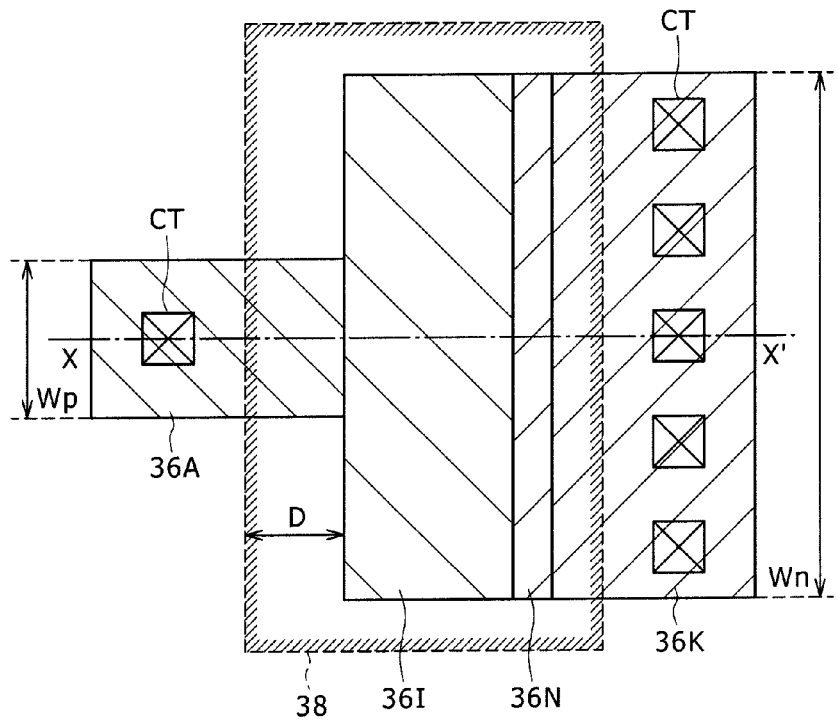
FIG. 5A is a plan view of a photodiode of a PIN structure provided in the liquid crystal display according to the first embodiment of the invention.
Figure 5B:
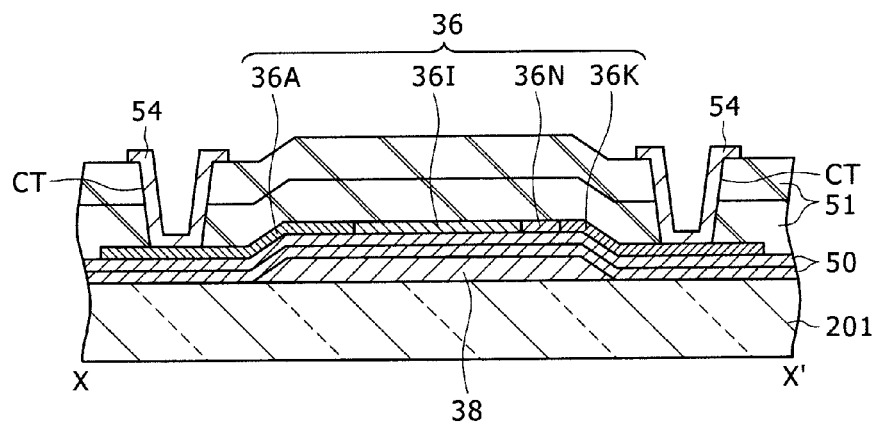
FIG. 5B is a sectional view taken along line X-X' of FIG. 5A.

FIG. 5A is a plan view of the thin film photodiode PD of the PIN structure, and FIG. 5B is a sectional view taken along line X-X' of FIG. 5A. In FIG. 5B, wirings such as the VDD line 31 and the configuration of the second interlayer insulator film 52 and the upper layers are omitted.

For example, the control gate 38 having a "metallic film" is formed over the TFT array substrate 201, the two gate insulator films 50 are formed on the upper side thereof, and the semiconductor layer 36 is formed on the upper side thereof.

The semiconductor layer 36 has a pattern shape as shown in FIG. 5A. Specifically, an anode region 36A having a P⁺ region (P-type semiconductor region), an I-region (intrinsic semiconductor region) 36I, a low-concentration semiconductor region (N⁻ region) 36N, and a cathode region 36K having an N⁺ region (N-type semiconductor region) are laid out. In this manner, a thin film photodiode of the PIN structure having a low-concentration semiconductor region is configured.

Incidentally, in the case of the PDN structure, a D-region (N⁻ region) is formed in place of the I-region.

In addition, the layout of the control gate 38 in relation to the above-mentioned regions is as shown in FIG. 5A.

The first interlayer insulator film 51 is formed to cover the photodiode, and is connected to contact plugs 54 through contact holes CT reaching the anode region 36A and the cathode region 36K.

In the photodiode as above, when a reverse bias is impressed, a depletion layer develops (is widened) inside the I-region (or the D-region). For promoting the depletion process, back gate control (control of the electric field by the control gate CG) is conducted. It is to be noted here that in the PIN structure, the depletion proceeds to about 10 μm from the P⁺ region; on the other hand, in the PDN structure, substantially the whole region of the D-region is depleted, which is advantageous in that the area with light reception sensitivity is widened accordingly. In the present embodiment, each of the PIN structure and the PDN structure can be adopted.

The thin film photodiode as a position sensor with such a structure is designed to have sensitivity, desirably a peak of sensitivity, to non-visible light.

The non-visible light, for example, include infrared light or ultraviolet light. Incidentally, according to CIE (Commission International de l'Eclaiage), the boundary of wavelength between the ultraviolet light (also, an example of the non-visible light) and the visible light is 360 to 400 nm, and the boundary of wavelength between the visible light and the infrared light is 760 to 830 nm. It should be noted here, however, it may practically be interpreted that light with wavelengths of not more than 350 is ultraviolet light, and light with wavelengths of not less than 700 nm is infrared light. Here, the wavelength ranges of the non-visible light are the range of not more than 350 nm and the range of not less than 700 nm. It is to be noted here, however, that in the present embodiment, the boundaries of wavelength of the non-visible light may be specified arbitrarily within the above-mentioned ranges of 360 to 400 nm and 760 to 830 nm.

In the case of using infrared light (IR light) as the non-visible light, the thin film semiconductor layer 36 constituting the thin film photodiode PD having a peak of sensitivity in the wavelength range of the IR light, preferably, has an energy bandgap smaller than that (for example, 1.6 eV) of a light receiving element for visible light. For example, such a thin film photodiode PD can be fabricated from polycrystalline silicon or crystalline silicon having an energy bandgap between valence band and conduction band of 1.1 eV, which is smaller than the energy bandgap (for example, 1.6 eV) of the light receiving element for the visible light.

As to the energy bandgap Eg, an optimal value is calculated from the formula $Eg=h\nu$ (where h is Plank's constant, and $\nu=1/\lambda$ ($\lambda$ is the wavelength of the light)).

On the other hand, when the thin film semiconductor layer 36 is formed from amorphous silicon or microcrystalline silicon, light-receiving ability (sensitivity) is attained for both infrared light and ultraviolet light, since these semiconductor materials have distributions of the energy bandgap level. Therefore, a thin film photodiode PD formed by use of any of these semiconductor materials has a light-receiving ability for not only the visible light but also the non-visible light inclusive of infrared light and ultraviolet light, and can be utilized as a light receiving element for visible light and non-visible light.

From the foregoing, the thin film photodiode PD which can be preferably utilized in the present embodiment preferably has a semiconductor layer 36 formed from polycrystalline silicon, microcrystalline silicon, amorphous silicon, or crystalline silicon.

In any way, the thin film photodiode PD in the present embodiment is fabricated by selecting and designing the semiconductor material so that the absorbance for non-visible light such as infrared light and ultraviolet light will be higher than those of photodiodes designed for reception of visible light.

Here, referring to FIG. 3, a light detecting operation of the photo-sensor part having the above-mentioned thin film photodiode will be discussed.

When a method is adopted in which after a current generated upon irradiation of the thin film photodiode with light is stored in a storage capacitance in a pixel and converted into a voltage, the signal is amplified by the amplifying transistor TA to thereby achieve reading of the signal, the sensor signal sensitivity (voltage) can be expressed as: (photoelectric current)×(exposure time)/(current storage capacitance).

Accordingly, in order to increase the sensor signal sensitivity there may be contemplated the following methods: (1) to increase the photoelectric current, (2) to prolong the exposure time, and (3) to reduce the current storage capacitance.

Particularly in the case of utilizing the parasitic capacitance of an element as the current storage capacitance, the sensor signal sensitivity voltage can be improved by reducing the parasitic capacity through a device structure.

(Layout Example of Thin Film Photodiode)

A layout is adopted in which the width Wp of the anode region (P⁺ region) 36A in a direction perpendicular to the direction of connected to the cathode region (N⁺ region) 36K is different from the width Wn of the cathode region (N⁺ region) 36K in the direction perpendicular to the direction of connection to the anode region (P⁺ region) 36A.

The above configuration can be made to be a configuration in which the area of an overlapping region of the anode region (P⁺ region) 36A and the control gate 38 as viewed from one surface side or the other surface side is different from the area of an overlapping region of the cathode region (N⁺ region) 36K and the control gate 38.

Specifically, it is possible to reduce the parasitic capacity between the anode region (P⁺ region) 36A or the cathode region (N⁺ region) 36K, which is reduced in width so as to reduce the overlapping area thereof with the control gate 38, and the control gate 38.

Here, in the case of taking the just-mentioned overlapping region into consideration, the low-concentration semiconductor region (N⁻ region) 36N may be made to be part of the cathode region 36K. In the case where the area occupied by the low-concentration semiconductor region (N⁻ region) 36N is very small and in the case where the N-type impurity concentration is very low, this region may be excluded from consideration. The same applies hereinbelow.

In the present embodiment, for example, the control gate 38 is in the state of being connected to the cathode region (N⁺ region) 36K. Here, the width Wp of the anode region (P⁺ region) 36A in the direction perpendicular to the direction of connection to the cathode region (N⁺ region) 36K is smaller than the width Wn of the cathode region (N⁺ region) 36K in the direction perpendicular to the direction of connection to the anode region (P⁺ region) 36A.

By the just-mentioned configuration, a configuration can be obtained in which the area of the overlapping region of the anode region (P⁺ region) 36A and the control gate 38 as viewed from the one surface side or the other surface side is smaller than the area of the overlapping region of the cathode region (N⁺ region) 36K and the control gate 38. This ensures that the parasitic capacitance Cgp between the control gate 38 and the anode region (P+ region) can be reduced.

Particularly, in the thin film photodiode PD, the ratio R1 of the width Wp of the anode region (P+ region) 36A to the width Wn of the cathode region (N+ region) is preferably in the range of $0.3 \leq R1 < 1$.

The reason why setting the ratio R1 to within the just-mentioned range is preferable will be described in Examples later.

Or, in the case of a configuration in which the control gate 38 is connected to the anode region (P+ region) 36A, unlike in the case of the photodiode shown, the following configuration is adopted. The configuration to be adopted is such that the width Wp of the anode region (P+ region) 36A in the direction perpendicular to the direction of connection to the cathode region (N+ region) 36K is greater than the width Wn of the cathode region (N+ region) 36K in the direction perpendicular to the direction of connection to the anode region (P+ region) 36A.

As a result of the just-mentioned configuration, the area of the overlapping region of the anode region (P+ region) 36A and the control gate 38 as viewed from the one surface side or the other surface side is greater than the area of the overlapping region of the cathode region (N+ region) 36K and the control gate 38. This ensures that the parasitic capacitance Cgn between the control gate 38 and the cathode region (N+ region) 36K can be reduced, similarly to the above.

Particularly, in the thin film photodiode PD, the ratio R2 of the width Wn of the cathode region (N+ region) 36K to the width Wp of the anode region (P+ region) is preferably in the range of $0.3 \leq R2 < 1$.

The reason why setting the ratio R2 to within the just-mentioned range is preferable will be described in Examples later.

(Connection of Cathode Region and Gate Electrode)

Figure 6A:
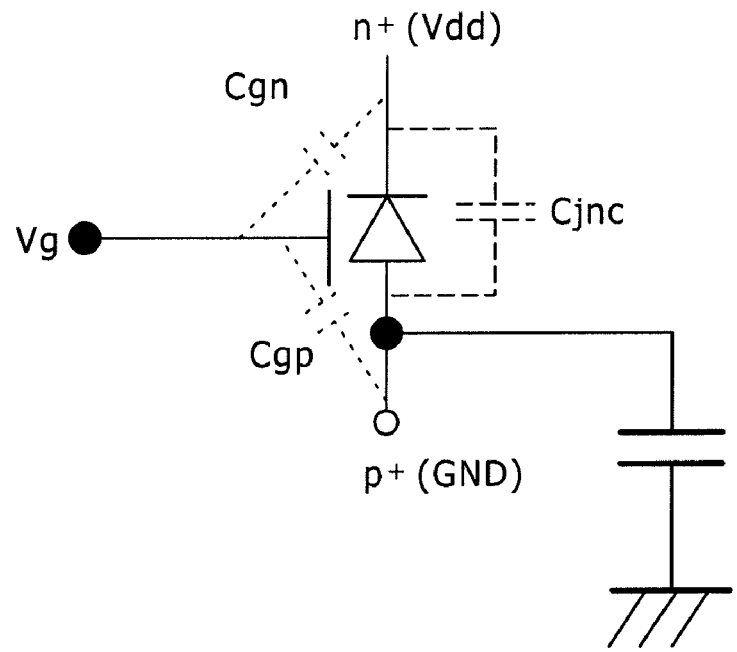
FIGS. 6A and 6B are circuit diagrams showing the parasitic capacitances present at a thin film photodiode and a control gate according to the first embodiment of the invention.

FIG. 6A is a circuit diagram showing the parasitic capacitances present at the thin film photodiode and the control gate.

Figure 6B:
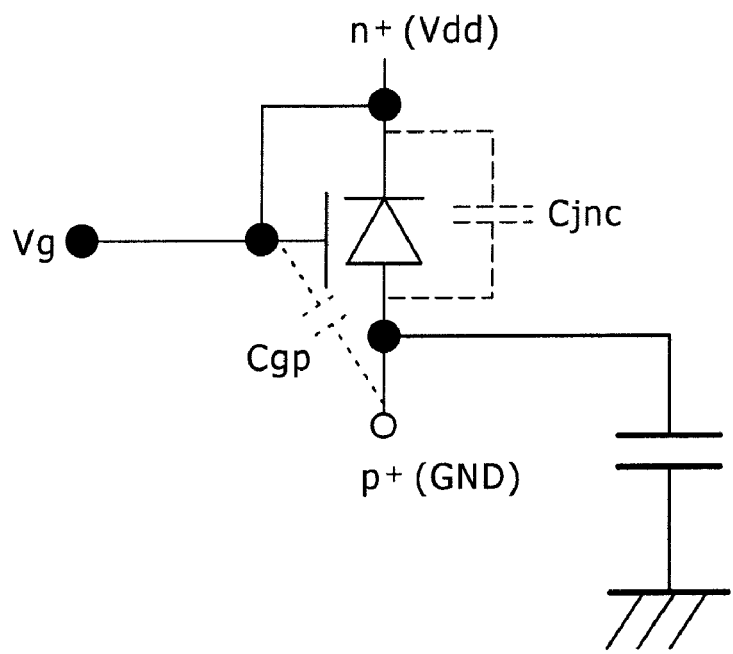

At the thin film photodiode and the control gate, the following parasitic capacitances are present.
(1) a parasitic capacitance Cgp between the control gate 38 and the anode region (P+ region) 36A
(2) a parasitic capacitance Cgn between the control gate 38 and the cathode region (N+ region) 36K
(3) a parasitic capacitance Cjnc of junction between the anode region (P+ region) 36A and the cathode region (N+ region) 36K In the case where the control gate 38 is connected to the cathode region (N+ region) 36K, as above-mentioned, the circuit diagram of FIG. 6A becomes as shown in FIG. 6B.

In other words, the parasitic capacitance Cgn between the control gate 38 and the cathode region (N+ region) 36K becomes apparently absent. Accordingly, the above-mentioned current storage capacitance is represented by the sum of the parasitic capacitance Cgp between the control gate 38 and the anode region (P+ region) 36A and the parasitic capacitance Cjnc of junction between the anode region (P+ region) 36A and the cathode region (N+ region) 36K.

On the contrary, where the control gate 38 is connected to the anode region (P+ region) 36A, the parasitic capacitance Cgp between the control gate 38 and the anode region (P+ region) 36A becomes apparently absent. Accordingly, the current storage capacitance Cgn is represented by the sum of the parasitic capacitance Cgn between the control gate 38 and the cathode region (N+ region) 36K and the parasitic capacitance Cjnc of junction between the anode region (P+ region) 36A and the cathode region (N+ region) 36K.

With the above-mentioned configuration in which the control gate 38 is connected to the cathode region (N+ region) 36K or the anode region (P+ region) 36A, the parasitic capacitance Cgn or the parasitic capacitance Cgp is made to be apparently absent. This reduces the parasitic capacitance, whereby the sensor signal sensitivity voltage can be improved.

Here, it is preferable that the control gate 38 is connected to that one of the anode region (P+ region) 36A and the cathode region (N+ region) 36K which is greater in the parasitic capacitance formed between itself and the control gate 38, namely, higher in the capacitance value of the parasitic capacitance Cgp, Cgn, as above-mentioned. The greater one of the parasitic capacitances Cgp and Cgn is thus made to be apparently absent, whereby the parasitic capacitance-reducing effect can be enhanced.

The thin film photodiode PD as above has a parasitic capacitance Cgp composed of the P-type semiconductor region (anode region (P+ region) 36A) and the metallic film (control gate 38) opposed to each other through the insulator film (gate insulator film 50) therebetween. In addition, the thin film photodiode PD has a parasitic capacitance Cgn composed of the N-type semiconductor region (cathode region (N+ region) 36K) and the metallic film (control gate 38) opposed to each other through the insulator film (gate insulator film 50) therebetween.

In the present embodiment, the area of the overlapping region of the anode region (P+ region) 36A and the control gate 38 as viewed from the one surface side and the other surface side is different from the area of the overlapping region of the cathode region (N+ region) 36K and the control gate 38. This results in that the capacitance value of the parasitic capacitance Cgp and the capacitance value of the parasitic capacitance Cgn are different from each other.

As a result, in this configuration, the parasitic capacitance is reduced, i.e., the current storage capacitance is reduced, as compared to that in a thin film photodiode of a configuration according to the related art.

Further, the control gate 38 is connected to that one of the anode region (P+ region) 36A and the cathode region (N+ region) 36K which is greater in the parasitic capacitance composed between itself and the control gate 38 through the gate insulator film 50 therebetween, i.e., to the greater one of the parasitic capacitances Cgp and Cgn.

This ensures that the greater one of the parasitic capacitances Cgp and Cgn can be made to be apparently absent, whereby the parasitic capacitance can be further reduced, i.e., the current storage capacitance can be further reduced.

According to the liquid crystal display including the photosensor parts each having the thin film photodiode pertaining to the present embodiment, the sensor signal sensitivity can be increased through reducing the current storage capacitance which is the parasitic capacitance, as above-described.

In the configuration above, a variation in the width Wp of the anode region (P+ region) may produce an influence on the sensitivity; therefore, it is important to design this factor with sufficient investigation.

(Improvement in Sensor Sensitivity and Improvement in Saturation Characteristics)

Meanwhile, in the case where the sensitivity of the photosensor part is increased by reducing the parasitic capacitance of the thin film photodiode as above-described, the saturation characteristics of the sensor would be influenced.

In the present embodiment, in the manner as described below, the components of the light incident on the thin film photodiode PD are examined precisely, and the light, the detection of which is desired in view of the operation of the thin film photodiode is made to be incident on the thin film photodiode as much as possible, so as to contrive simultaneous achievement of an improvement of the sensitivity of the sensor and an improvement of the saturation characteristics thereof.

The thin film photodiode PD having sensitivity for non-visible light as above-mentioned is liable to be lowered in S/N (signal to noise) by the "stray light" which does not reach the object to be detected but is repeatedly reflected inside the liquid crystal panel 200, thereby going round to the side of the thin film photodiode PD.

For example, the light incident on the thin film photodiode is classified into the following: (1) light noise entering the thin film photodiode after reflection at the interface between a polarizing plate and air; (2) light noise entering the thin film photodiode after reflection of the back-light light by metallic wiring; (3) light noise composed of the back-light light directly entering the thin film photodiode; and (4) light signal composed of the back-light light reflected from the user's finger.

As above-mentioned, when the non-visible light emitted from a back light impinges on and is reflected by the wirings such as the VDD line 31, the VSS line 32, the detection line 35, etc., the control gate 38 and the like, the quantity of the non-visible light reaching the front side of the panel is reduced. In addition to this, part of the non-visible light, before reaching the front side of the panel, is returned as the stray light to the side of the thin film photodiode PD, to be received by the thin film photodiode PD as a noise component.

Here, the operation of the thin film photodiode is considered. In the case where the control gate 38 is connected to the cathode region ($N^+$ region) 36K, a depletion layer is formed in the vicinity of the boundary between the anode region ($P^+$ region) 36A and the I-region 36I, so that the optical sensitivity is raised in that region.

Therefore, the prevention of the back light-derived stray light from entering the I-region 36I leads to suppression of the incidence of the stray light on the portion of the higher optical sensitivity of the thin film photodiode PD, to an improvement of the S/N, and to a widening of the dynamic range.

The control gate 38 provided in the thin film photodiode in the present embodiment is a metallic film, whereby it is possible to prevent the incidence of the stray light coming from the back light.

More specifically, with a configuration in which the control gate 38 is laid out under the portion of the higher optical sensitivity, the incidence of the stray light can be restrained.

Particularly, the distance D between that end part of the anode region ($P^+$ region) 36A which is on the side of the cathode region ($N^+$ region) 36K and that end part of the control gate 38 which is on the side of the anode region ($P^+$ region) is preferably in the range of 1.5 to 3.0 μm.

Besides, the distance between that end part of the cathode region ($N^+$ region) 36K which is on the side of the anode region ($P^+$ region) 36A and that end part of the control gate 38 which is on the side of the cathode region ($N^+$ region) 36K is preferably in the range of 1.5 to 3.0 μm.

The reason why setting the distances to within the just-mentioned ranges is preferable will be described in Examples later.

(Operation)

Now, an illustrative operation example of the liquid crystal display 100 will be described below.

In a pixel region, the back light 300 is disposed on the back-side surface side of the liquid crystal panel 200. Illuminating light from the back light 300 is transmitted through the first polarizing plate 206, the TFT array substrate 201, the liquid crystal layer 203, the color filter 204, the color filter substrate 202, and the second polarizing plate 207, to be emitted from the front-side surface for displaying images.

In this process of transmission, the light being transmitted is polarized into a first direction at the time of being transmitted through the first polarizing plate 206. When the light is transmitted through the liquid crystal layer 203, the direction of polarization of the light being transmitted is varied by a predetermined angle along the molecular orientation direction by an optical anisotropic effect of the liquid crystal molecules. When the light is transmitted through the second polarizing plate 207, the light being transmitted is polarized into a second direction shifted by a predetermined angle from the first direction.

During the process of the three times of polarizing actions, the angle of polarization during transmission through the liquid crystal layer 203 is varied independently on a pixel basis, by controlling the intensity of the electric field impressed on the liquid crystal layer 203 according to the potential of the picture signal inputted. Therefore, the light passing through each of the pixels undergoes modulation such as to obtain a brightness according to the potential of the picture signal, before being emitted from the liquid crystal panel 200 for realizing a predetermined image displaying.

On the other hand, the light passing through the photo-sensor parts in the sensor region does not undergo the modulation due to an electrical signal, unlike the light being transmitted through the pixels, and is emitted intact from the liquid crystal panel 200.

During the image displaying, there is a case in which a user's direction is prompted in the display contents according to an application, for example. In such a case, the user lightly touches the display screen with his finger or with a stylus pen or the like.

When the user's finger or the stylus pen or the like as an object to be detected has come into contact with or proximity to the display screen, the light emitted from the liquid crystal panel 200 is reflected by the object and is returned into the liquid crystal panel 200. The light thus returned (reflected light) undergoes repeated refraction and reflection at layer interfaces and reflective objects such as wirings present in the liquid crystal panel 200, so that the reflected light usually proceeds while being dispersed in the liquid crystal panel 200. Accordingly, through depending on the size of the object to be detected, the reflected light eventually reaches at least one of the plurality of photo-sensor parts 1.

When part of the reflected light having reached the photo-sensor part 1 is incident on the thin film photodiode PD on which a predetermined reverse bias is impressed, the thin film photodiode PD performs photo-electric conversion, to generate a photoelectric charge. The photoelectric charge is stored (accumulated) in the storage node SN which is the current storage capacitance composed of the anode region ($P^+$ region) 36A and the like, and is outputted through the amplifying transistor TA connected to the storage node SN. The amount of charge in this instance represents light reception data proportional to the quantity of light received. The light reception data (charge amount) is outputted as a detection potential Vdet or a detection current Idet from the detection line 35 in a reading circuit shown in FIG. 3B.

The detection potential Vdet or detection current Idet is sent by the switch array (SEL.SW.) 14 shown in FIG. 2 to the side of the sensor driver 13, where it is collected as light reception data, and the light reception data thus collected is inputted to the position detecting block 402 in the data processing section 400 shown in FIG. 1. The position detecting block 402 or the control block 401 is being sequentially supplied in a real-time manner with pairs of row and column addresses on the basis of the detection potential Vdet or detection current Idet from the side of the liquid crystal panel 200. Therefore, in the data processing section 400, in-panel position information of the object to be detected (the detection potential Vdet or detection current Idet) is stored in a memory (not shown) in the state of being related to the row-direction and column-direction address information.

Based on the information in the memory, the liquid crystal display 100 superimposes the position information on the object to be detected and the displayed information on each other, whereby it can be determined that "the user has made a direction based on the displayed information by use of his finger or a stylus pen or the like." Alternatively, it can be determined that "the user has inputted predetermined information by moving the stylus pen or the like on the display screen." Thus, in the liquid crystal display 100, a function similar to that obtained by adding a touch panel to a liquid crystal display 200 can be realized with a thin type display panel without any touch panel added thereto. Such a display panel is called an "in-cell touch panel."

(Method of Forming Thin Film Photodiode)

Now, a method of forming the thin film photodiode provided in the photo-sensor part in the liquid crystal display according to the present embodiment will be described below.

Figure 7A:
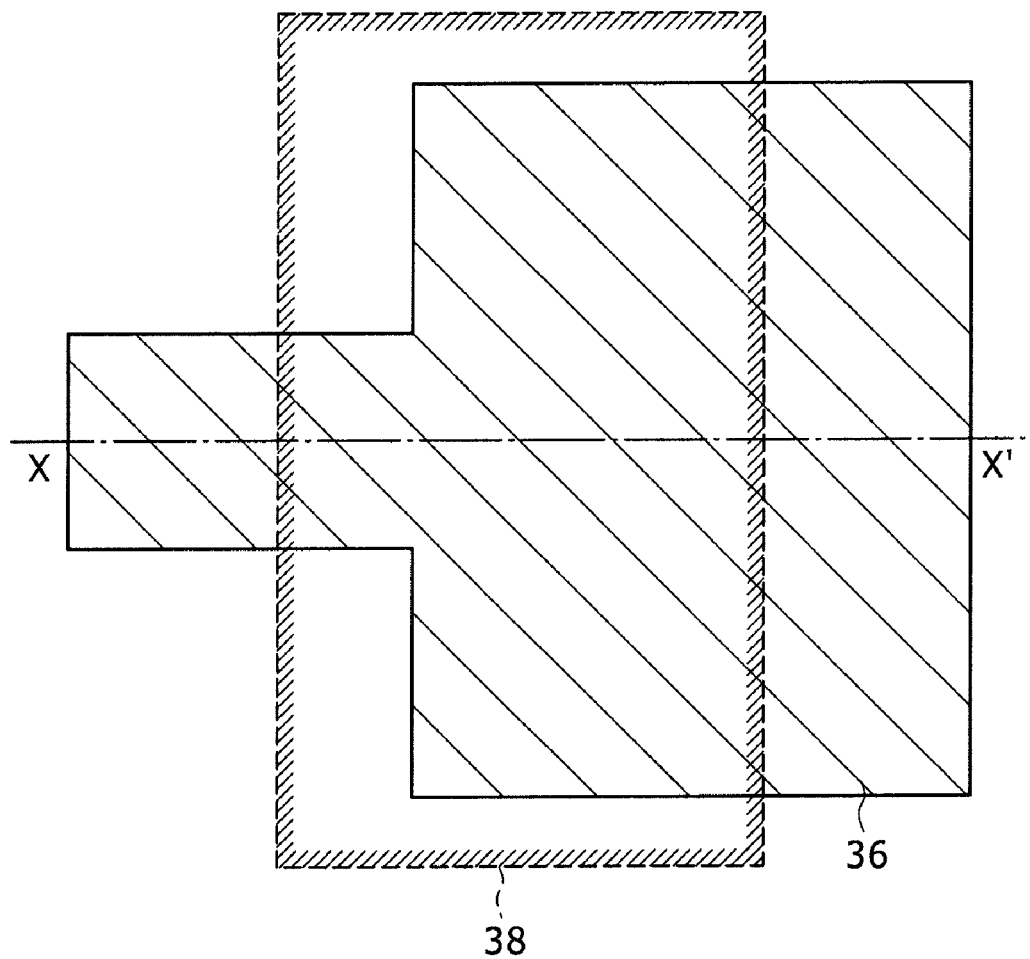
FIG. 7A is a plan view illustrating a step in a process of forming the thin film photodiode provided in the liquid crystal display according to the first embodiment of the invention.
Figure 7B:
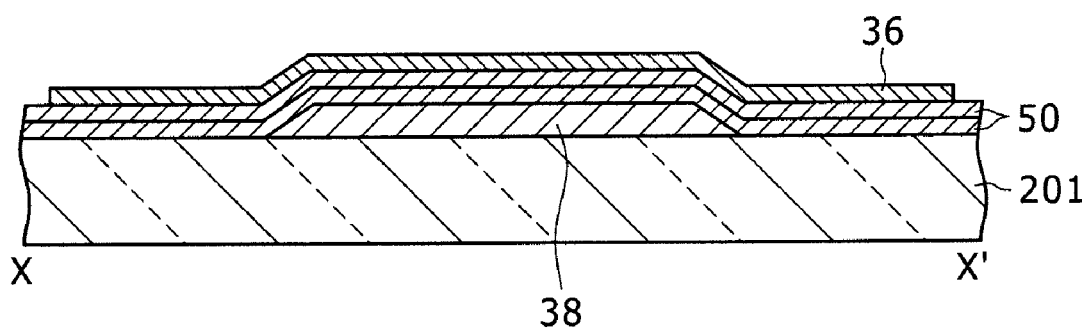
FIG. 7B is a sectional view taken along line X-X' of FIG. 7A.

FIG. 7A is a plan view illustrating a step in a process of forming the thin film photodiode provided in the liquid crystal display, and FIG. 7B is a sectional view taken along line X-X' of FIG. 7A.

For example, a metallic film of molybdenum or the like is formed on a TFT array substrate 201 by sputtering or the like, and is patterned into a control gate pattern, to form a control gate 38.

Next, for example by CVD (chemical vapor deposition) or the like, silicon nitride and silicon oxide are layered, to form gate insulator films 50.

Subsequently, for example by CVD or the like, a semiconductor such as poly-silicon is deposited, and is patterned into a thin film photodiode pattern, to form a semiconductor layer 36. The semiconductor layer 36 has a semiconductor which directly forms an intrinsic semiconductor region of a PIN diode unless a conductive impurity is introduced thereinto by ion implantation.

Figure 8A:
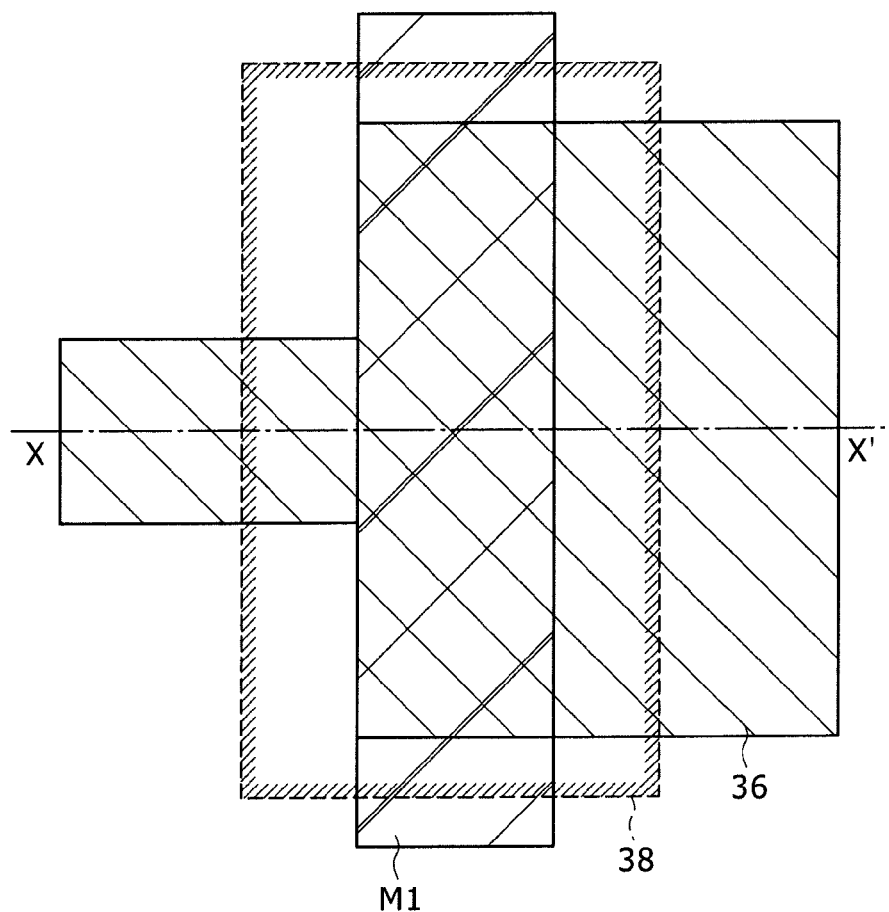
FIG. 8A is a plan view illustrating a step subsequent to the step shown in FIGS. 7A and 7B.
Figure 8B:
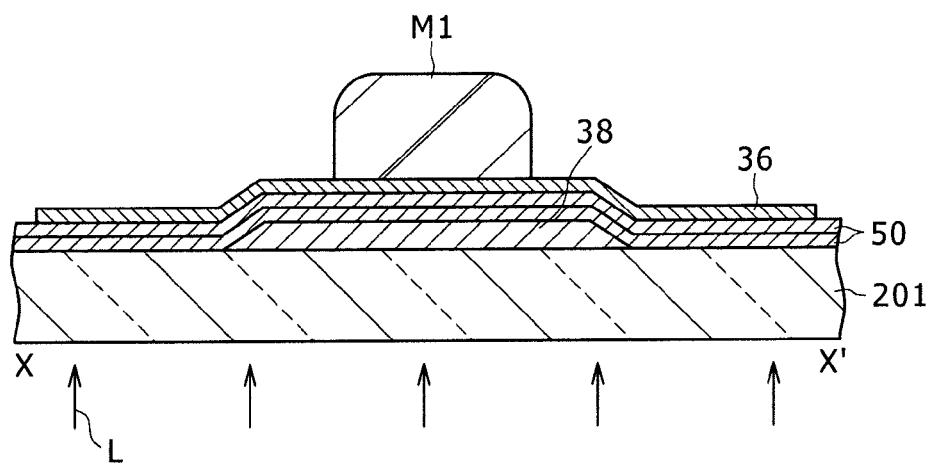
FIG. 8B is a sectional view taken along line X-X' of FIG. 8A.

FIG. 8A is a plan view illustrating a step subsequent to the step shown in FIGS. 7A and 7B, and FIG. 8B is a sectional view taken along line X-X' of FIG. 8A.

Next, for example by coating or the like, a photoresist film is formed over the whole area on the upper side of the semiconductor layer 36. Subsequently, the TFT array substrate 201 is irradiated with light over the whole area from the one surface (back-side surface) side to expose the photoresist film to the light using the control gate 38 as a mask, thereby pattern-forming a resist mask M1 in such a pattern as to protect a semiconductor portion to be an intrinsic semiconductor region.

By the exposure to light while using the control gate 38 as a mask, the resist mask M1 can be pattern formed in a self-aligned manner in relation to the control gate 38.

Figure 9A:
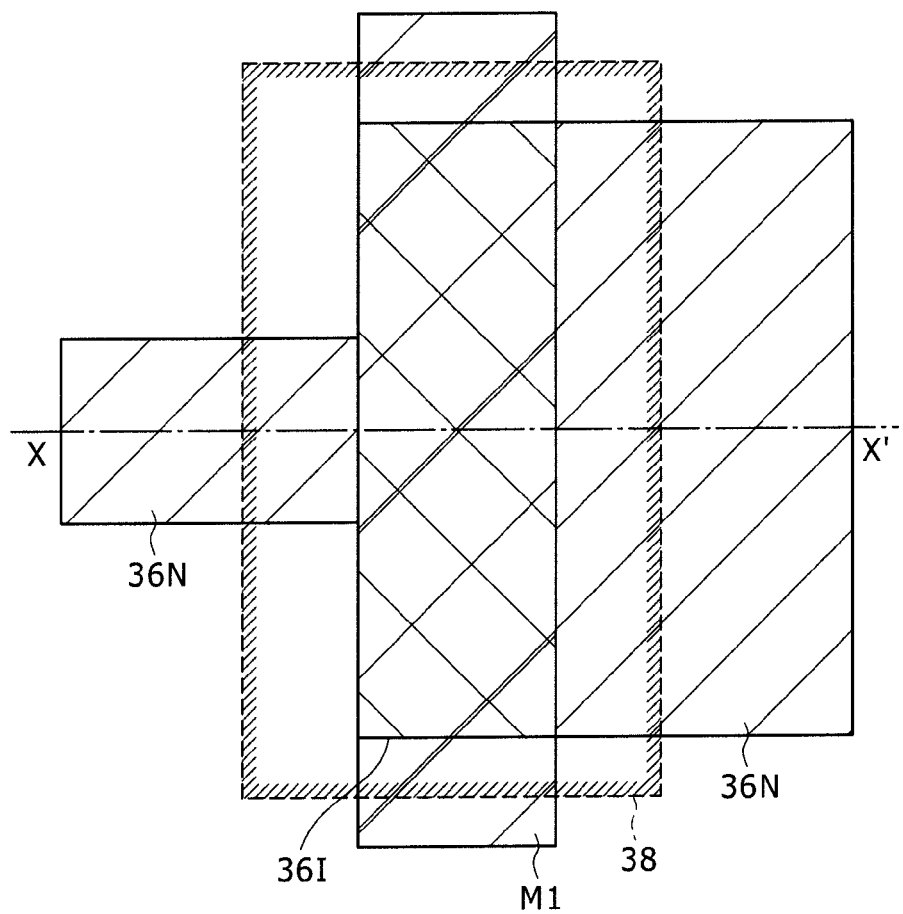
FIG. 9A is a plan view illustrating a step subsequent to the step shown in FIGS. 8A and 8B.
Figure 9B:
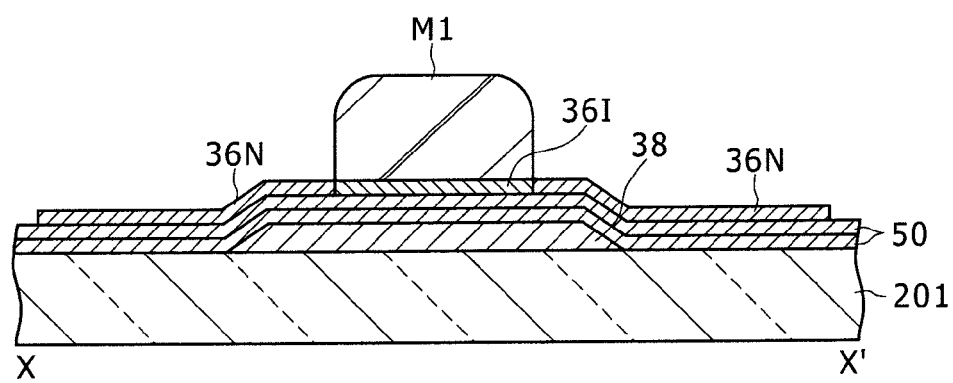
FIG. 9B is a sectional view taken along line X-X' of FIG. 9A.

FIG. 9A is a plan view illustrating a step subsequent to the steps shown in FIGS. 8A and 8B, and FIG. 9B is a sectional view taken along line X-X' of FIG. 9A.

Subsequently, for example, ion implantation of an N-type conductive impurity in a low concentration is conducted using the resist mask M1 as a mask, to form a low-concentration semiconductor region 36N containing the N-type conductive impurity in a low concentration.

In this instance, the portion protected by the resist mask M1 becomes an I-region (intrinsic semiconductor region) 36I.

Figure 10A:
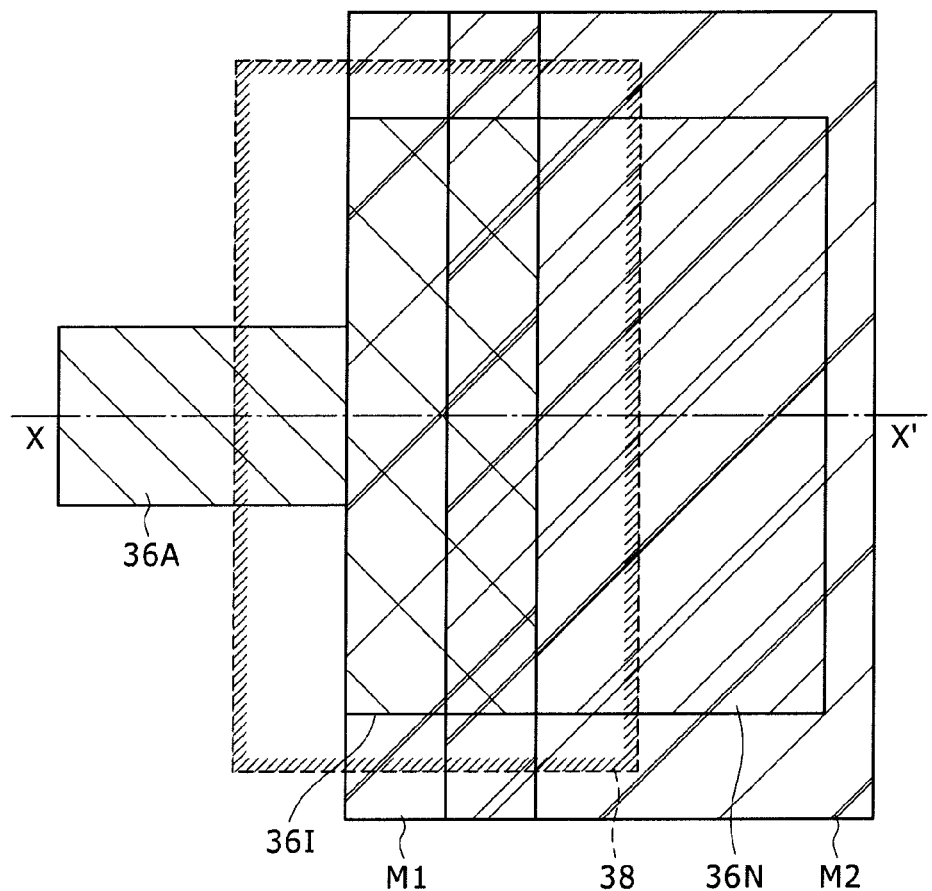
FIG. 10A is a plan view illustrating a step subsequent to the step shown in FIGS. 9A and 9B.
Figure 10B:
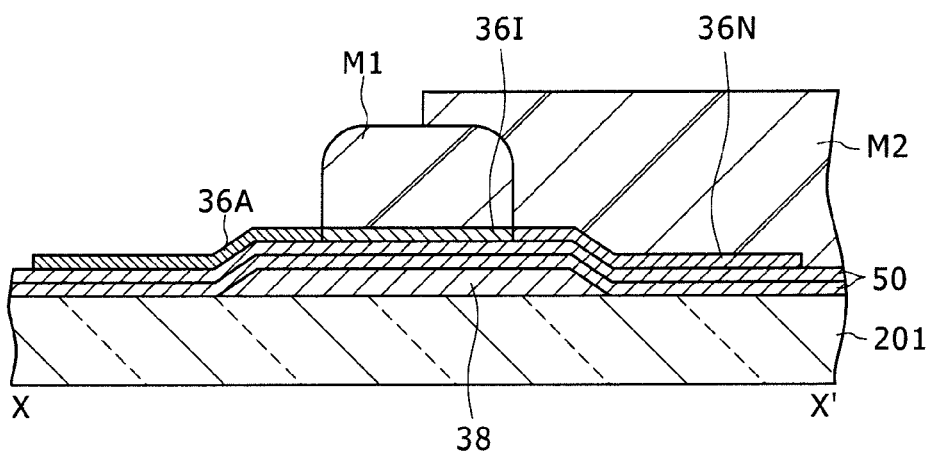
FIG. 10B is a sectional view taken along line X-X' of FIG. 10A.

FIG. 10A is a plan view illustrating a step subsequent to the step shown in FIGS. 9A and 9B, and FIG. 10B is a sectional view taken along line X-X' of FIG. 10A.

Next, for example, while leaving the resist mask M1 as it is, a resist mask M2 in such a pattern as to open a region to be an anode region ($P^+$ region) 36A is patterned by a photolithographic step. Here, the resist mask M2 is so set as to partly overlap with the resist mask M1 so that the resist mask M1 and the resist mask M2 in combination are in a pattern for protecting the other portion than the anode region ($P^+$ region) 36A.

Subsequently, for example, using the resist mask M1 and the resist mask M2 as a mask, a P-type conductive impurity is introduced into the low-concentration semiconductor region 36N in the exposed portion in a high concentration by ion implantation, to form the anode region ($P^+$ region) 36A containing the P-type conductive impurity in a high concentration.

The positions of end parts of the anode region ($P^+$ region) 36A is determined by the resist mask M1, and, therefore, the anode region ($P^+$ region) 36A is formed in a self-aligned manner in relation to the control gate 38.

Figure 11A:
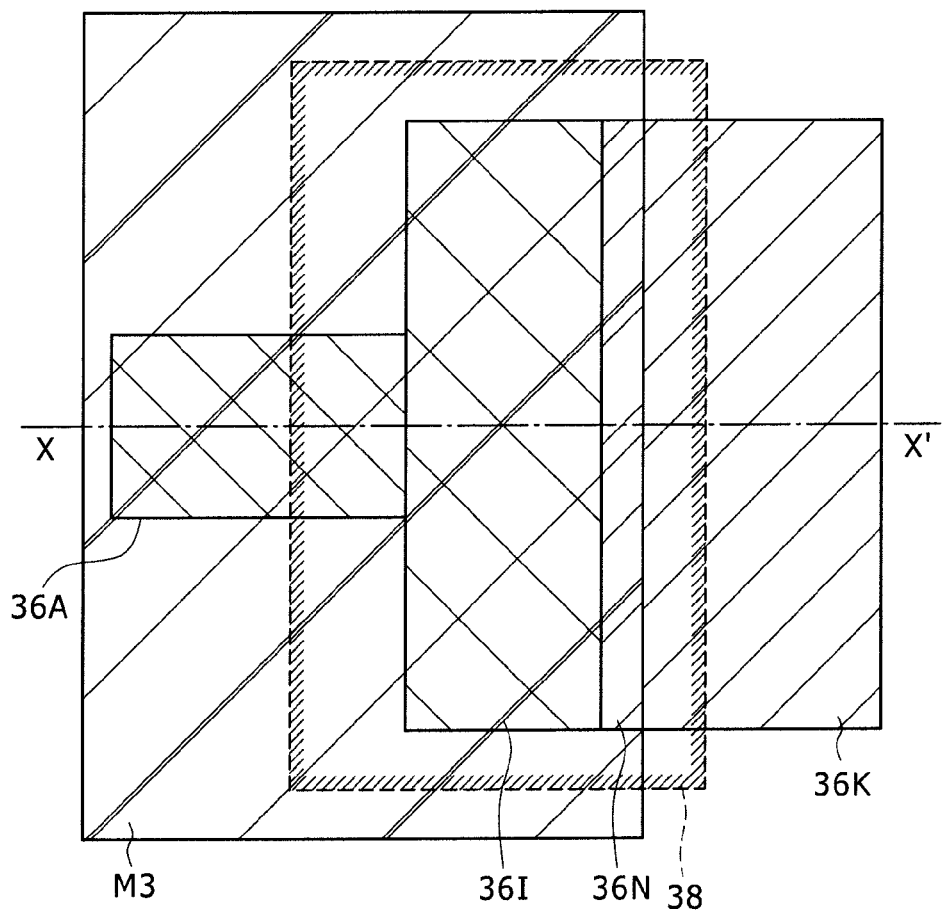
FIG. 11A is a plan view illustrating a step subsequent to the step shown in FIGS. 10A and 10B.
Figure 11B:
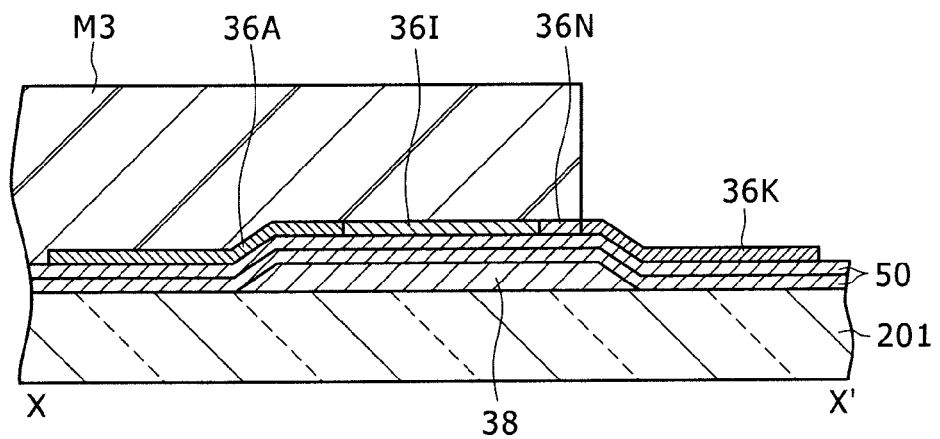
FIG. 11B is a sectional view taken along line X-X' of FIG. 11A.

FIG. 11A is a plan view illustrating a step subsequent to the step shown in FIGS. 10A and 10B, and FIG. 11B is a sectional view taken along line X-X' of FIG. 11A.

Next, for example, the resist mask M1 and the resist mask M2 are peeled off, and a resist mask M3 in such a pattern as to open a portion to be a cathode region ($N^+$ region) 36K is patterned by a photolithographic step. Here, in order to ensure that the low-concentration semiconductor region 36N will be left between the cathode region ($N^+$ region) 36K and the I-region 36I, the resist mask M3 is so formed as to protect the low-concentration semiconductor region 36N in a predetermined width.

Subsequently, for example, using the resist mask M3 as a mask, an N-type conductive impurity is introduced into the low-concentration semiconductor region 36N in the exposed portion in a high concentration by ion implantation, to form the cathode region ($N^+$ region) 36K containing the N-type conductive impurity in a high concentration.

In the subsequent steps, for example, the resist mask M3 is peeled off. Next, for example, by CVD, a first interlayer insulator film 51 is formed over the whole area on the upper side of the semiconductor layer 36 inclusive of the anode region ($P^+$ region) 36A, the I-region (intrinsic semiconductor region) 36I, the low-concentration semiconductor region 36N, and the cathode region ($N^+$ region) 36K. Subsequently, contact holes reaching the anode region ($P^+$ region) 36A and the cathode region ($N^+$ region) 36K respectively are opened, and the contact holes are each filled with a conductor layer, to form contact plugs 54.

In the manner as above, the thin film photodiode provided in the photo-sensor part in the liquid crystal display according to the present embodiment as shown in FIGS. 5A and 5B can be formed.

MODIFIED EXAMPLE

Figure 12A:
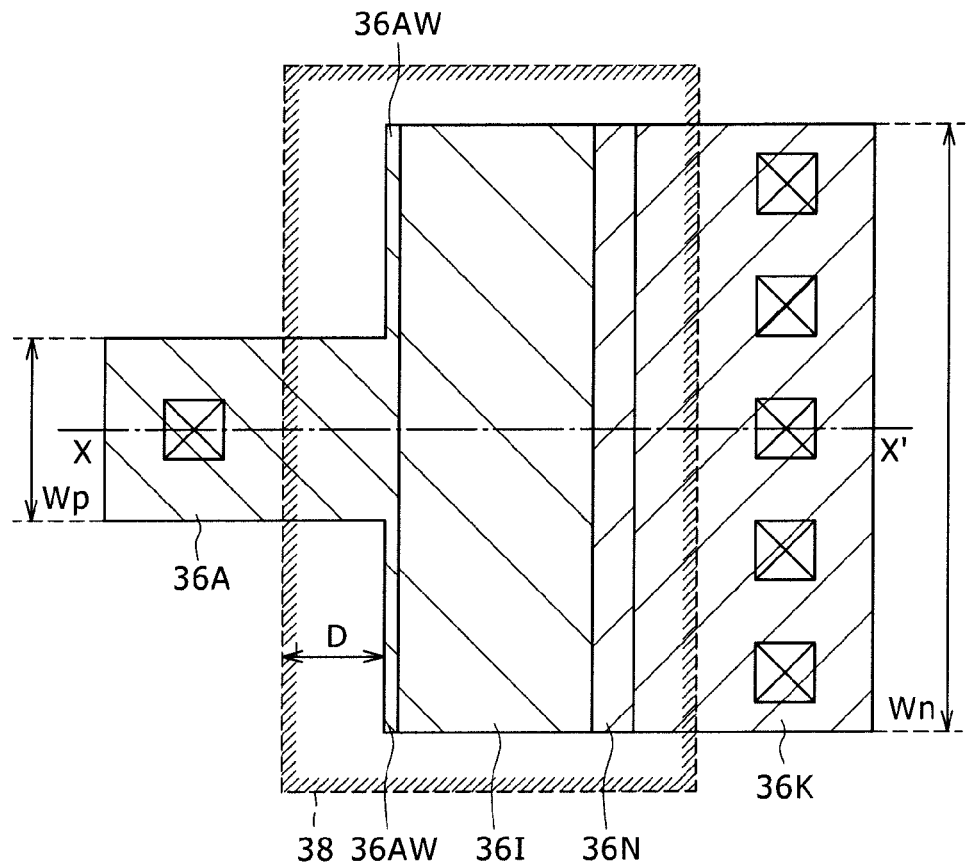
FIG. 12A is a plan view of a photodiode of a PIN structure provided in a liquid crystal display according to a modified example of the embodiment of the invention.
Figure 12B:
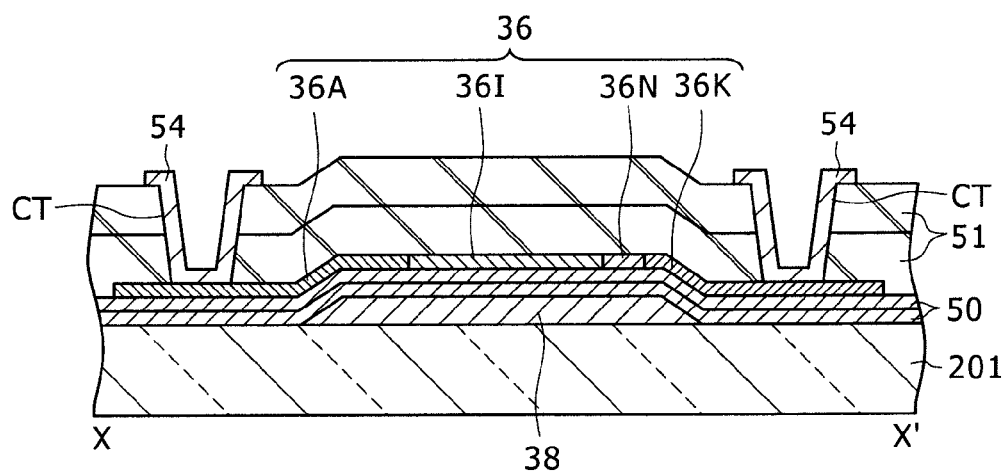
FIG. 12B is a sectional view taken along line X-X' of FIG. 12A.

FIG. 12A is a plan view of a thin film photodiode PD of the PIN structure, and FIG. 12B is a sectional view taken along line X-X' of FIG. 12A;

This thin film photodiode PD is a photodiode having a configuration substantially the same as that shown in FIGS. 5A and 5B. In this configuration, the width Wp of an anode region ($P^+$ region) 36A in a direction perpendicular to the direction of connection to a cathode region (N⁺ region) 36K is smaller than the width Wn of the cathode region (N⁺ region) 36K in the direction perpendicular to the direction of connection to the anode region (P⁺ region) 36A. In the vicinity of that end part of the anode region (P⁺ region) 36A which is on the side of the cathode region (N⁺ region) 36K, an anode region (P⁺ region) part 36AW having a width equivalent to the width Wn of the cathode region (N⁺ region) 36K (or the width of the I-region (intrinsic semiconductor region) 36I) is provided.

This makes it possible to restrain the photoelectric current flowing between the anode region (P⁺ region) 36A and the cathode resin (N⁺ region) 36K from being reduced due to the narrowing of the width Wp of the anode region (P⁺ region) 36A. In addition, it is also possible to restrain the sensitivity-increasing effect from being lowered due to the narrowing of the width Wp of the anode region (P⁺ region) 36A.

Besides, there is the merit that the influences of errors in matching or alignment of interface positions in the fabrication steps are smaller than those in the configuration shown in FIGS. 5A and 5B.

Example 1

As a thin film photodiode shown in FIGS. 5A and 5B, a thin film photodiode according to an existing example in which the width Wp of the anode region (P⁺ region) 36A and the width Wn of the cathode region (N⁺ region) 36K are equally 100 µm were fabricated.

Here, the dependency of the gate capacitance Cg as viewed from the gate terminal on the voltage Vg impressed on the control gate was examined, by short-circuiting the anode region (P⁺ region) 36A and the cathode region (N⁺ region) 36K. Here, the width of the I-region 36I disposed so as to be interposed between the anode region (P⁺ region) 36A and the cathode region (N⁺ region) 36K was varied to be 4.5 µm (a), 5.5 µm (b), 6.5 µm (c), 7.5 µm (d), 8.5 µm (e), and 9.5 µm (f), respectively. In this case, the overlap between the control gate and the cathode region (N⁺ region) 36K and the overlap between the control gate and the anode region (P⁺ region) 36A were kept unchanged.

Figure 13:
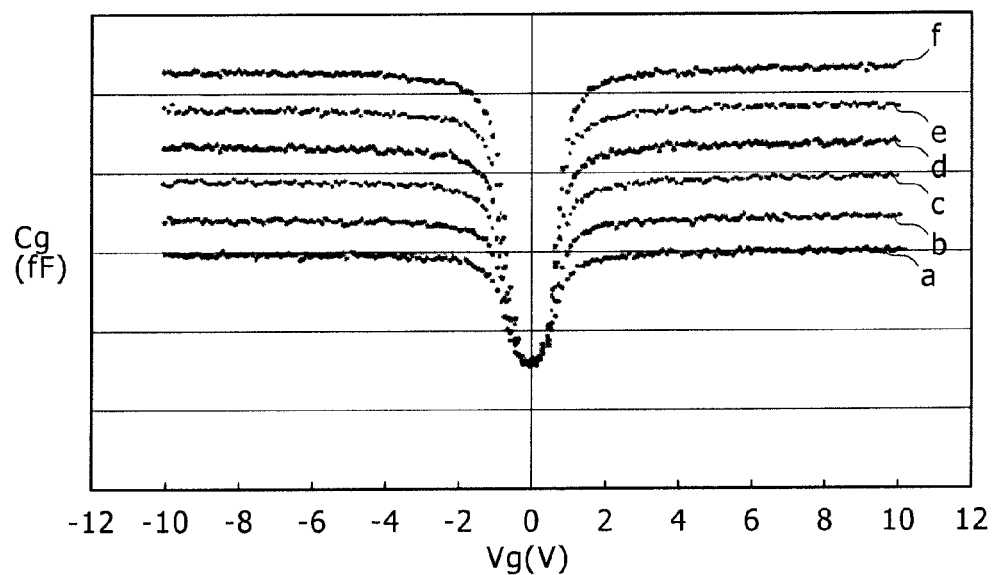
FIG. 13 is a diagram showing dependence of gate capacitance as viewed from a gate terminal on a voltage impressed on a control gate, according to Example 1.

The results of the above examination are shown in FIG. 13.

In the case where a certain extent of voltage was impressed on the control gate, the gate capacitance Cg was greater as the width of the I-region 36I is larger. However, when the voltage on the control gate is set to 0 V, the gate capacitance Cg was constant (about 150 fF), independent of the width of the I-region 36I.

Figure 14:
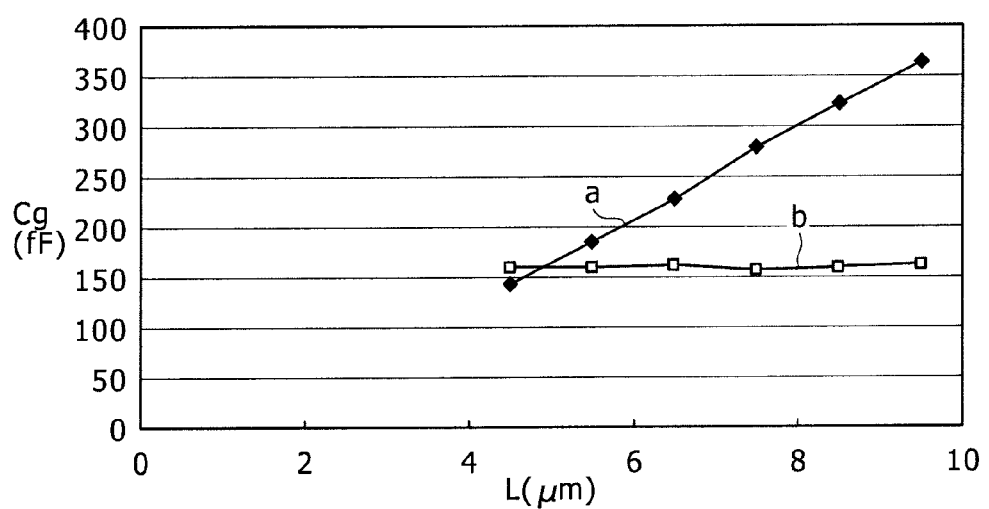
FIG. 14 is an illustration obtained by plotting the results of FIG. 13.

FIG. 14 is a diagram showing graphs obtained from the above results by plotting (a) the gate capacitance Cg upon application of a gate voltage of 10 V and (b) the gate capacitance Cg upon application of a gate voltage of 0 V, against the width L of the I-region 36I.

When the gate voltage of 10 V was impressed, the gate capacitance Cg was greater as the width of the I-region 36I was larger.

When the gate voltage was 0 V, the gate capacitance Cg was constant (about 150 fF), independent of the width of the I-region 36I.

In the above results, the gate capacitance increasing with the width of the I-region 36I corresponds to the channel capacitance. On the other hand, the gate capacitance Cg being constant independently of the width of the I-region 36I is considered to be due to a parasitic capacitance which is determined by the overlap between the control gate and the cathode region (N⁺ region) 36K and the overlap between the control gate and the anode region (P⁺ region) 36A.

Example 2

Based on the configuration of the thin film photodiode shown in FIGS. 5A and 5B, thin film photodiodes were fabricated by setting the width Wn of the cathode region (N⁺ region) 36K to 100 µm and varying the width Wp of the anode region (P⁺ region) 36A, and variation in the parasitic capacitance Cp with the variation in the width Wp was measured.

Figure 15:
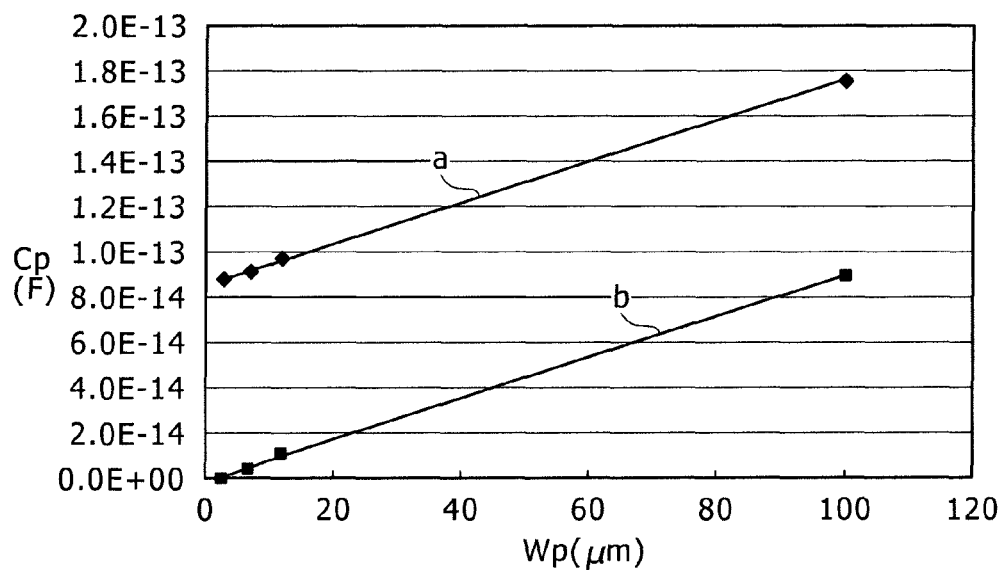
FIG. 15 is a diagram showing the dependence of parasitic capacitance on anode region width, according to Example 2.

The results are shown in FIG. 15, in which (a) represents the parasitic capacitance as viewed from the control gate 38, and (b) represents the parasitic capacitance as viewed from the anode region (P⁺ region) 36A.

As is seen from the figure, the parasitic capacitance component as viewed from the control gate 38 and the parasitic capacitance component as viewed from the anode region (P⁺ region) 36A in the case where the control gate 38 and the cathode region (N⁺ region) 36K are connected to each other are both decreased with a decrease in the width of the anode region (P⁺ region) 36A. Thus, it has been verified that reducing the amount of overlap between the control gate 38 and the anode region (P⁺ region) 36A and the amount of overlap between the control gate 38 and the cathode region (N⁺ region) 36K is an effective technique for reducing the parasitic capacitance.

In this case, since the sensor signal sensitivity (voltage) is represented by (photoelectric current)×(exposure time)/(current storage capacitance) as above-mentioned, the sensor sensitivity can be enhanced if a reduction in the capacitance can be realized under a constant photoelectric current.

Example 3

In the same manner as in Example 2, based on the configuration of the thin film photodiode shown in FIGS. 5A and 5B, thin film photodiodes were fabricated by varying the width Wp of the anode region (P⁺ region) 36A while keeping the width Wn of the cathode region (N⁺ region) 36K at a constant value of 100 µm. Using the thin film photodiodes thus obtained, variation in the photoelectric current Inp with the width Wp was measured.

Figure 16:
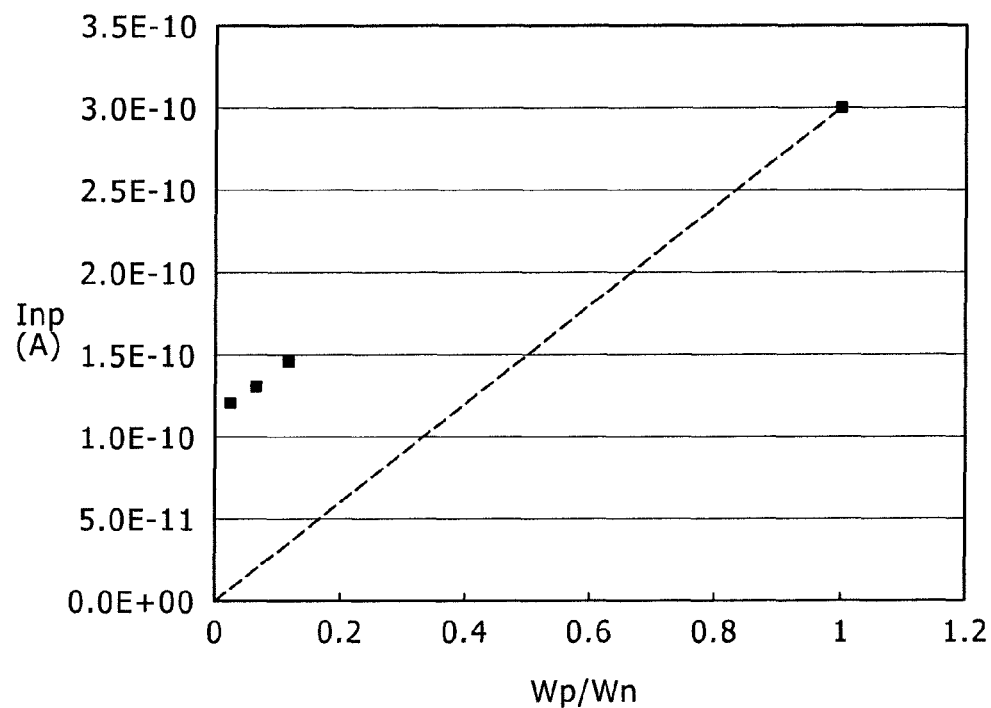
FIG. 16 is a diagram showing the dependence of photoelectric current on anode region width, according to Example 3.

The results are shown in FIG. 16. Where the photoelectric current Inp is proportional to the width Wp of the anode region (P⁺ region) 36A, the data must be plotted on a broken line passing through the origin in the diagram. In practice, however, a photoelectric current greater than expected from the proportionality (linearity) was found to flow even when the width Wp of the anode region (P⁺ region) 36A was narrowed.

Specifically, in the case where one of the width Wn of the cathode region (N⁺ region) 36K and the width Wp of the anode region (P⁺ region) 36A is narrowed, the photoelectric current shows no extreme lowering, though not remaining constant. Thus, it has been shown that a reduction in the width Wn of the cathode region (N⁺ region) 36K or the anode region (P⁺ region) 36A can contribute to enhancement of sensitivity.

Example 4

As above-mentioned, the sensor signal sensitivity (voltage) can be expressed by (photoelectric current)×(exposure time)/(current storage capacitance). In view of this, for thin film photodiodes obtained by varying the width Wp of the anode region (P⁺ region) 36A while keeping the width Wn of the cathode region (N+ region) 36K at 100 µm, the relative sensitivities RS (relative values) were estimated under a constant exposure time.

Figure 17:
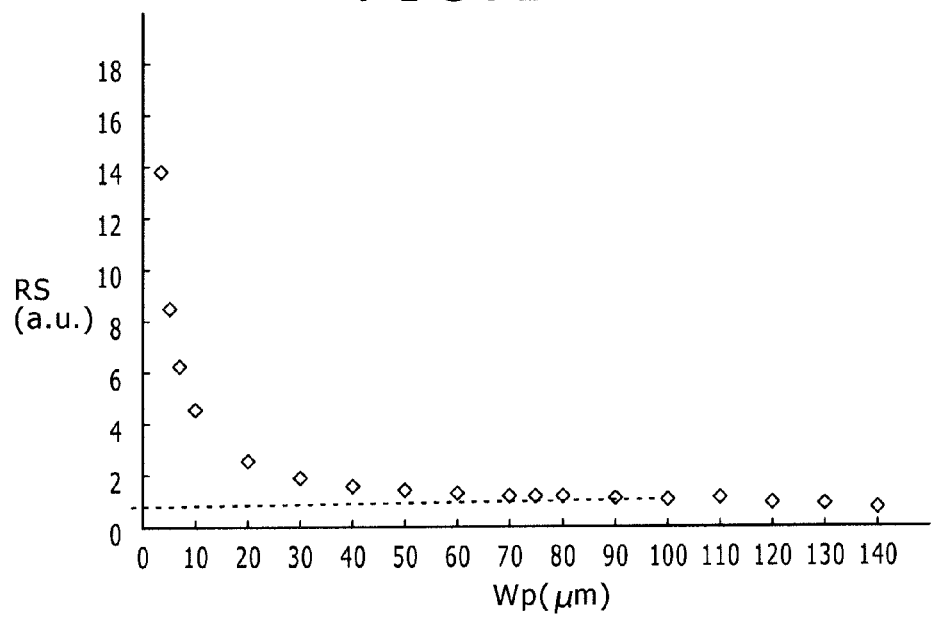
FIG. 17 is a diagram showing the dependence of relative sensitivity on anode region width, according to Example 4.

The results are shown in FIG. 17. It is seen that the relative sensitivity increases greatly as the width Wp of the anode region (P+ region) 36A is narrowed.

However, when the width Wp of the anode region (P+ region) 36A becomes too small, there arises a problem in that the sensitivity would be largely varied depending on the width Wp of the anode region (P+ region) that is formed in practice.

Taking this into account, in order to ensure that the sensor sensitivity is increased and yet the dispersion of the sensitivity is not enlarged, the width Wp of the anode region (P+ region) 36A is preferably in the range of from 30 µm, inclusive, to 100 µm, exclusive, where the width Wn of the cathode region (N+ region) 36K is 100 µm.

In other words, in the thin film photodiode PD, the ratio R1 of the width Wp of the anode region (P+ region) 36A to the width Wn of the cathode region (N+ region) 36K is preferably in the range of $0.3 \leq R1 < 1$.

Example 5

A simulation was carried out as to thin film photodiodes fabricated by varying the distance D between that end part of the anode region (P+ region) 36A which is on the side of the cathode region (N+ region) 36K and that end part of the control gate 38 which is on the side of the anode region (P+ region) 36A. Here, obtained by simulation was the relative light amount RL (relative value) corresponding to the noise component which is incident on the thin film photodiode after the reflection of the back-light light on wirings and the like.

Figure 18:
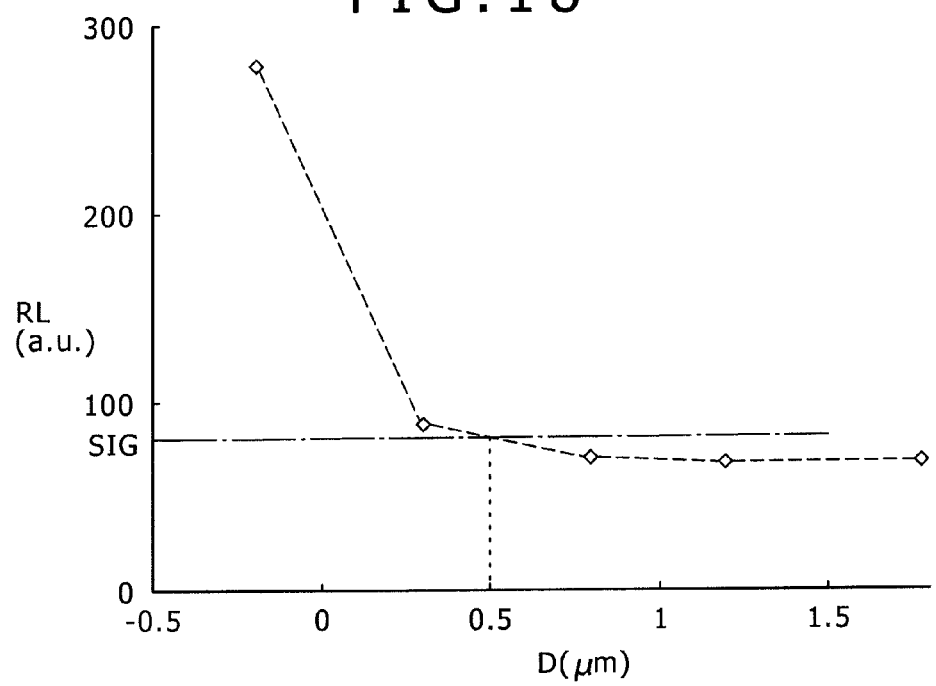
FIG. 18 is a diagram showing the dependence of relative light quantity corresponding to noise component on the distance between an end part of an anode region and an end part of a control gate, according to Example 5.

The results are shown in FIG. 18. It has been found that the relative light amount RL decreases as the distance D is increased.

Here, a practical light signal level SIG is shown in the figure. It has been found that the light signal level is greater in magnitude than the noise component when the distance D is set to be not less than 0.5 µm.

Example 6

In relation to the thin film photodiode as shown in FIGS. 5A and 5B, the following estimation was conducted on the assumption that the width Wn of the cathode region (N+ region) 36K is 100 µm, and the width Wp of the anode region (P+ region) 36A is 30 µm.

Here, the distance D between that end part of the anode region (P+ region) 36A which is on the side of the cathode region (N+ region) 36K and that end part of the control gate 38 which is on the side of the anode region (P+ region) 36A was varied. For the thin film photodiodes, the relative sensitivities RS (relative values) were estimated under a constant exposure time.

Figure 19:
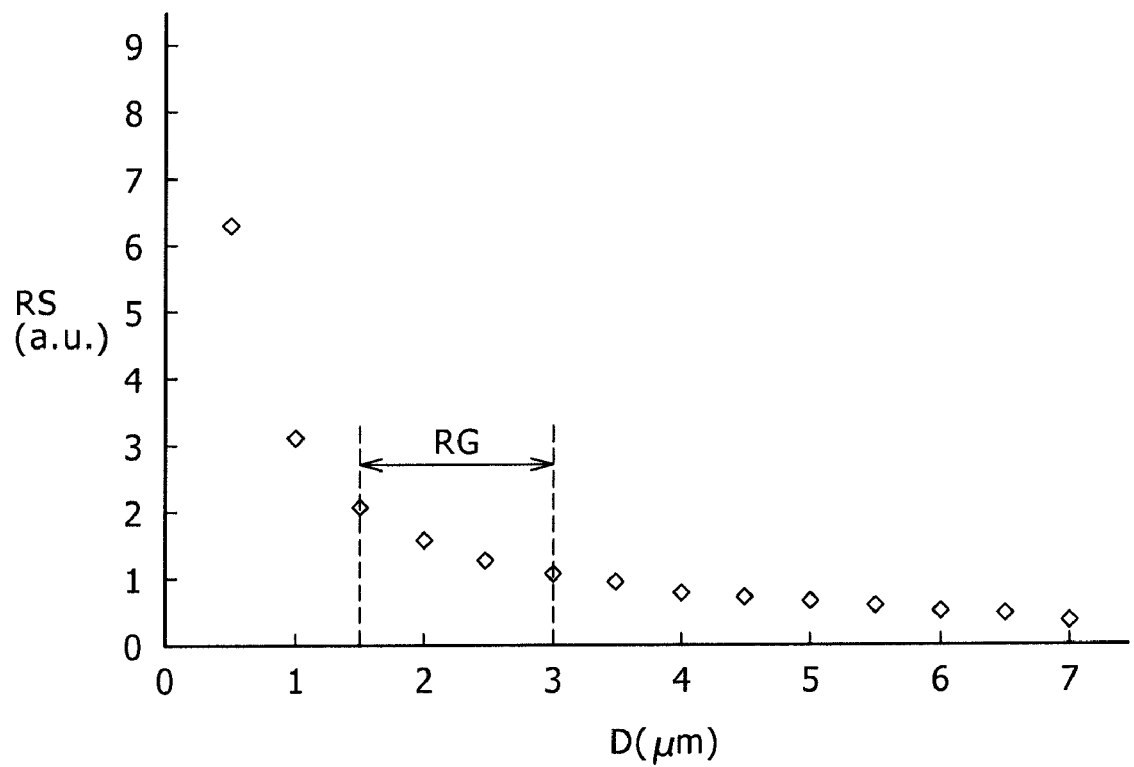
FIG. 19 is a diagram showing the dependence of relative sensitivity on the distance between the anode region end part and the control gate end part, according to Example 6.

The results are shown in FIG. 19. It has been found that the relative sensitivity RS decreases as the distance D increases.

As seen from the figure, it is preferable to set the distance D between that end part of the anode region (P+ region) 36A which is on the side of the cathode region (N+ region) 36K and that end part of the control gate 38 which is on the side of the anode region (P+ region) 36A to within the range of 1.5 to 3.0 µm. This makes it possible to realize stability of dispersion of the sensor sensitivity.

Example 7

As to the thin film photodiode shown in FIGS. 5A and 5B, the following estimation was carried out on the assumption that the width Wn of the cathode region (N+ region) 36K is 100 µm, and the width Wp of the anode region (P+ region) 36A is 30 µm.

Here, the distance D between that end part of the anode region (P+ region) 36A which is on the side of the cathode region (N+ region) 36K and that end part of the control gate 38 which is on the side of the anode region (P+ region) 36A was varied. For the thin film photodiodes, the light amounts $L_{SAT}$ (relative values) at which the signal is saturated, of the photosensor part, were estimated.

Figure 20:
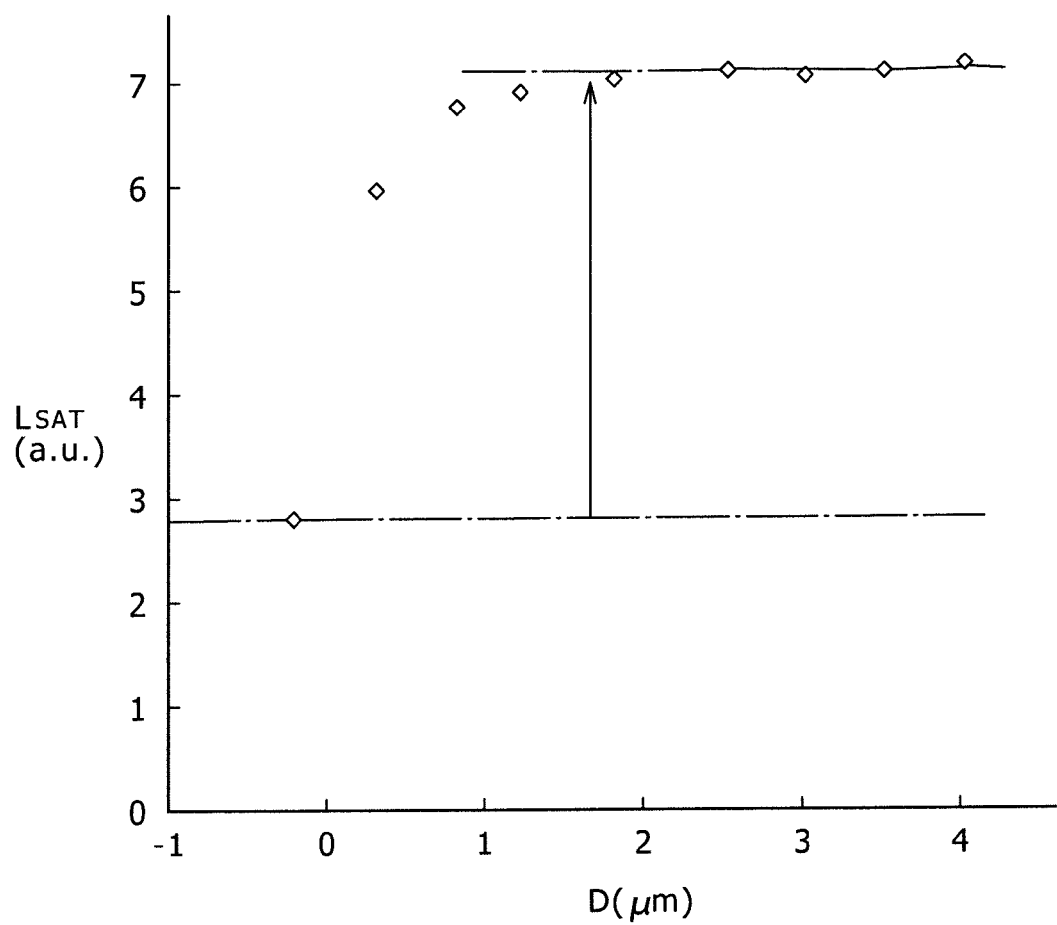
FIG. 20 is a diagram showing the dependence of the quantity of light for saturation of the signal at the photo-sensor part on the distance between the anode region end part and the control gate end part, according to Example 7.

The results are shown in FIG. 20. As seen from the figure, it is preferable to set the distance D between that end part of the anode region (P+ region) 36A which is on the side of the cathode region (N+ region) 36K and that end part of the control gate 38 which is on the side of the anode region (P+ region) 36A to within the range of 1.5 to 3.0 µm. This setting has been found to improve the saturation characteristic by a factor of 2.5 folds, as compared with the case where D=−0.2 µm.

Consequently, it has been found that the dynamic range is also improved, in addition to the sensitivity characteristics of the sensor.

According to the present embodiment and the modified example thereof, in each of the thin film photodiodes formed in the sensor region of the display section (substrate), the width of the P-type semiconductor region and the width of the N-type semiconductor region are different from each other. This makes it possible to reduce the parasitic capacitance between the thin film photodiode and the metallic film, thereby to enhance the detection sensitivity of the sensor, and to improve the saturation characteristic of the sensor.

Second Embodiment

Figure 21A:
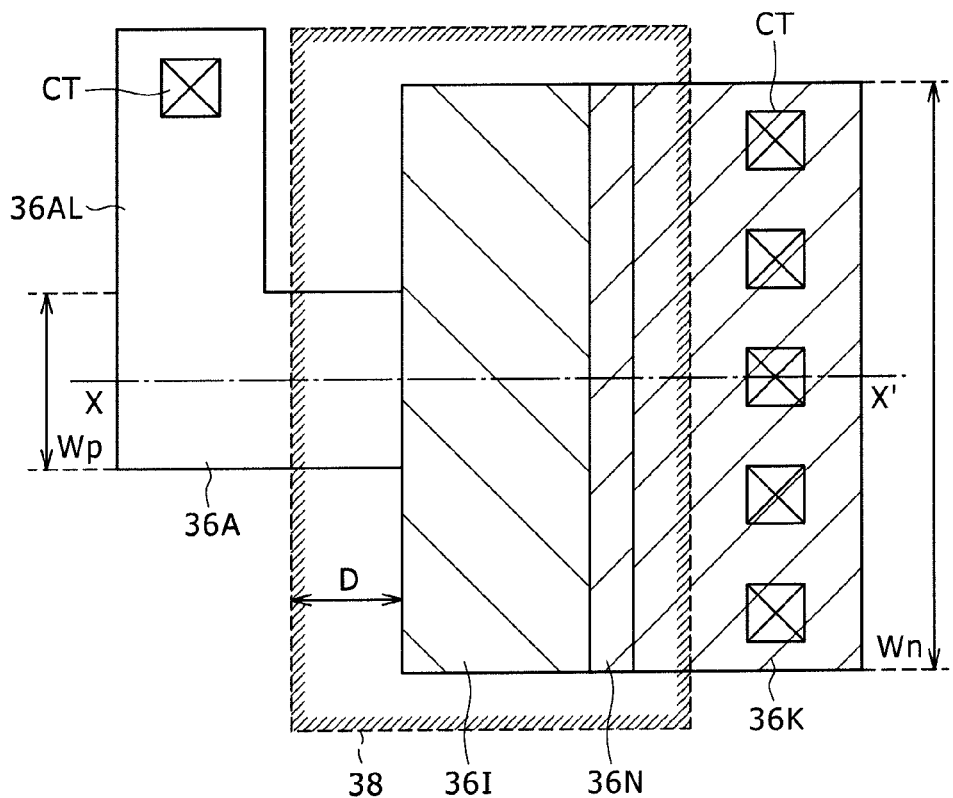
FIG. 21A is a plan view of a photodiode of a PIN structure provided in a liquid crystal display according to a second embodiment of the invention.
Figure 21B:
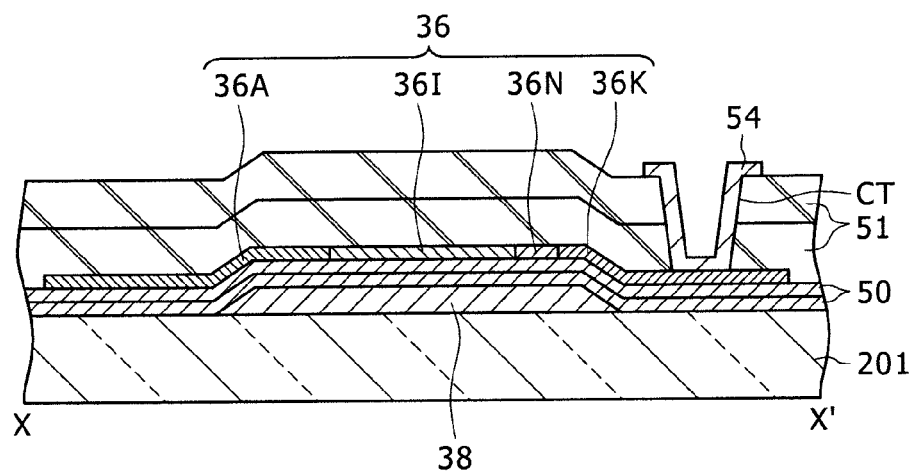
FIG. 21B is a sectional view taken along line X-X' of FIG. 21A.

FIG. 21A is a plan view of a thin film photodiode PD of the PIN structure according to the present embodiment, and FIG. 21B is a sectional view taken along line X-X' of FIG. 21A. In FIG. 21B, the wirings such as the VDD line 31 and the configuration of the second interlayer insulator film 52 and the upper layers are omitted. Excepting the configuration of the thin film photodiode PD, the display in the present embodiment has the same configuration as that in the first embodiment.

For example, a control gate 38 having a "metallic film" is formed on a TFT array substrate 201, two gate insulator films 50 are formed on the upper side thereof, and a semiconductor layer 36 is formed on the further upper side.

The semiconductor layer 36 has a pattern shape as shown in FIG. 21A. Specifically, an anode region 36A having a P+ region (P-type semiconductor region), an I-region (intrinsic semiconductor region) 36I, a low-concentration semiconductor region (N− region) 36N, and a cathode region 36K having an N+ region (N-type semiconductor region), are respectively laid out. A thin film photodiode of the PIN structure which has a low-concentration semiconductor region is thus configured.

In this layout, the width Wp of the anode region (P+ region) 36A in a direction perpendicular to the direction of connection to the cathode region (N+ region) 36K and the width Wn of the cathode region (N+ region) 36K in the direction perpendicular to the direction of connection to the anode region (P+ region) 36A are different from each other.

In addition, the layout of a control gate 38 in relation to these regions is as shown in FIG. 21A.

Here, the anode region (P+ region) 36A is provided, in the exterior of its region overlapping with the control gate 38, with an extension part 36AL extending in a direction perpendicular to the direction of connection to the cathode region (N+ region) 36K.

In addition, first interlayer insulator films 51 are formed so as to cover the photodiode, and are connected to contact plugs 54 through contact holes CT reaching the anode region (P+ region) 36A and the cathode region (N+ region) 36K. The contact hole reaching the anode region (P+ region) 36A is provided in the extension part 36AL.

In the present embodiment, a configuration is adopted in which the area of an overlapping region of the anode region (P+ region) 36A and the control gate 38 as viewed from the one surface side or the other surface side is different from the area of an overlapping region of the cathode region (N+ region) 36K and the control gate 38. This results in that the capacitance value of the parasitic capacitance Cgp is different from the capacitance value of the parasitic capacitance Cgn.

Consequently, a configuration is attained in which the parasitic capacitance is reduced, i.e., the current storage capacitance is reduced, as compared with a thin film photodiode having a configuration according to the related art.

Further, preferably, the control gate 38 is connected to that one of the anode region (P+ region) 36A and the cathode region (N+ region) 36K which is greater in the parasitic capacitance composed between itself and the control gate 38 opposed to each other through the gate insulation film 50 therebetween, i.e., to the greater one of the above-mentioned parasitic capacitances Cgp and Cgn. In the present embodiment, the control gate 38 is connected to the cathode region (N+ region) 36K.

This ensures that the greater one of the parasitic capacitances Cgp and Cgn can be made to be apparently absent, and the parasitic capacitance can be further reduced, i.e., the current storage capacitance can be further reduced.

According to the liquid crystal display including the photosensor parts each having the thin film photodiode pertaining to the present embodiment, the sensor signal sensitivity can be increased through reducing the current storage capacitance which is the parasitic capacitance, as above-mentioned.

In the thin film photodiode in the present embodiment, the structure of the anode region (P+ region) 36A in the exterior of the region overlapping with the control gate 38 is basically arbitrary.

On the other hand, for the reason which will be described later, it is preferable that the extension part 36AL is not provided or is as short as possible, and this is applicable, for example, to the case where some limitation is exerted on the opening regions of the contact holes.

Example 8

Thin film photodiodes of the display according to the first embodiment and thin film photodiodes of the display according to the second embodiment were fabricated. Here, the fabrication was carried out by varying the width Wp of the anode region (P+ region) 36A while keeping the width Wn of the cathode region (N+ region) 36K at a constant value of 100 μm. For these thin film photodiodes, variation in the parasitic capacitance with the width Wp was measured.

Figure 22:
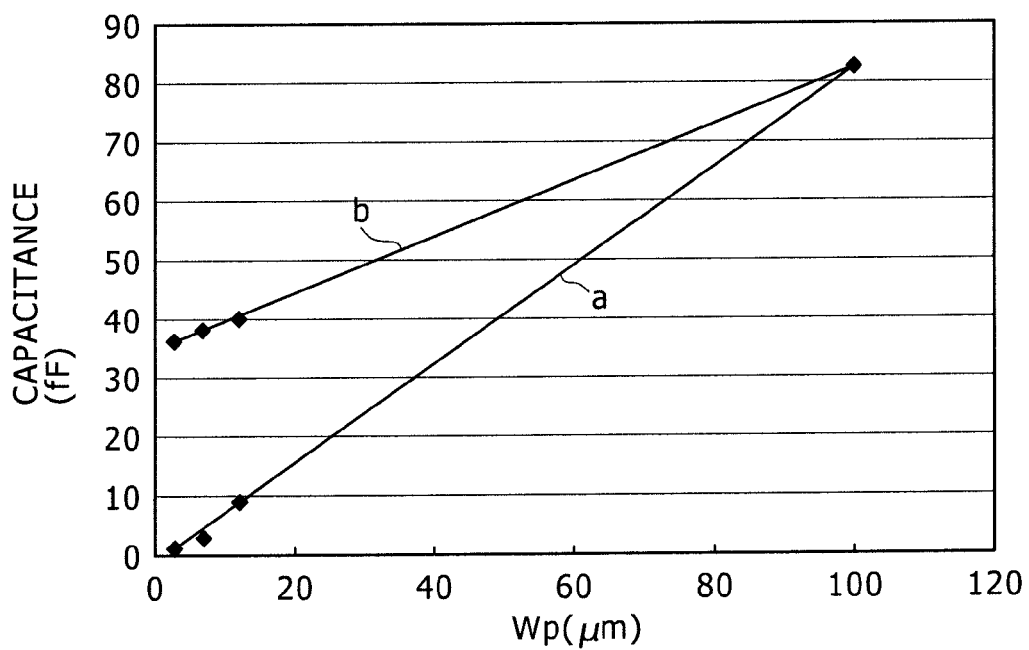
FIG. 22 is a diagram showing the dependence of parasitic capacitance as viewed from an anode region ($P^+$ region) on the width of the anode region ($P^+$ region), according to Example 8.

The results are shown in FIG. 22, in which (a) is the parasitic capacitance as viewed from the anode region (P+ region) 36A in the thin film photodiode configured according to the first embodiment, and (b) is the parasitic capacitance as viewed from the anode region (P+ region) 36A in the thin film photodiode configured according to the second embodiment.

The amount by which the parasitic capacitance can be reduced by narrowing the width Wp of the anode region (P+ region) 36A is greater in the thin film photodiode configured according to the first embodiment. Therefore, the configuration according to the first embodiment is preferred, in view of increasing the sensor signal sensitivity through reducing the current storage capacitance.

Third Embodiment

Figure 23A:
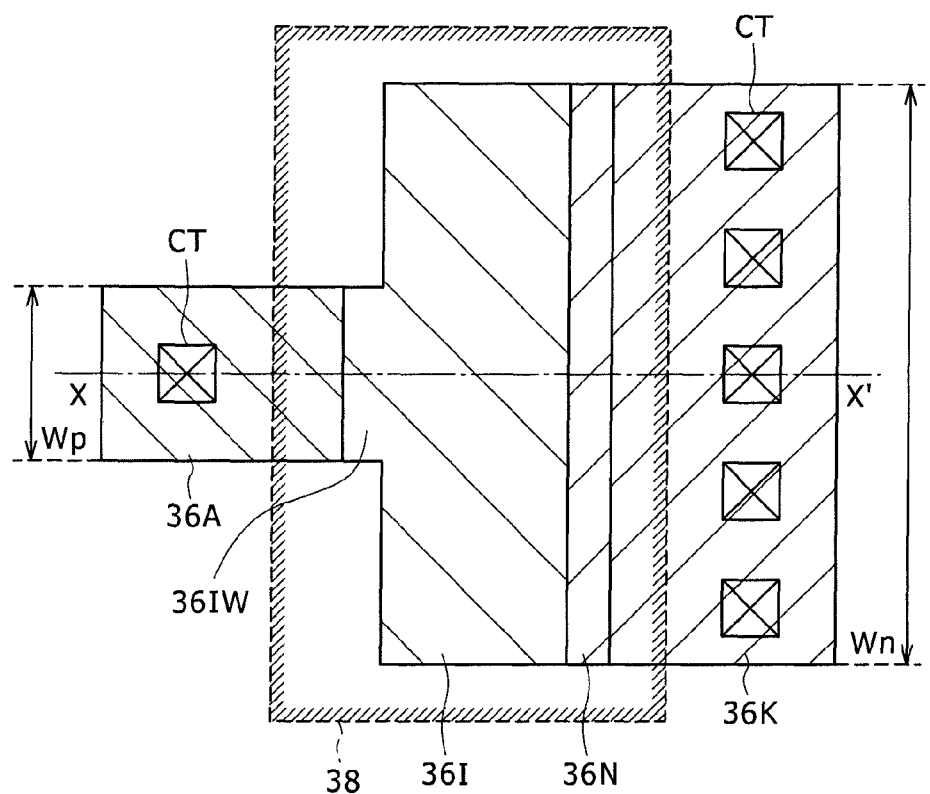
FIG. 23A is a plan view of a photodiode of a PIN structure provided in a liquid crystal display according to a third embodiment of the invention.
Figure 23B:
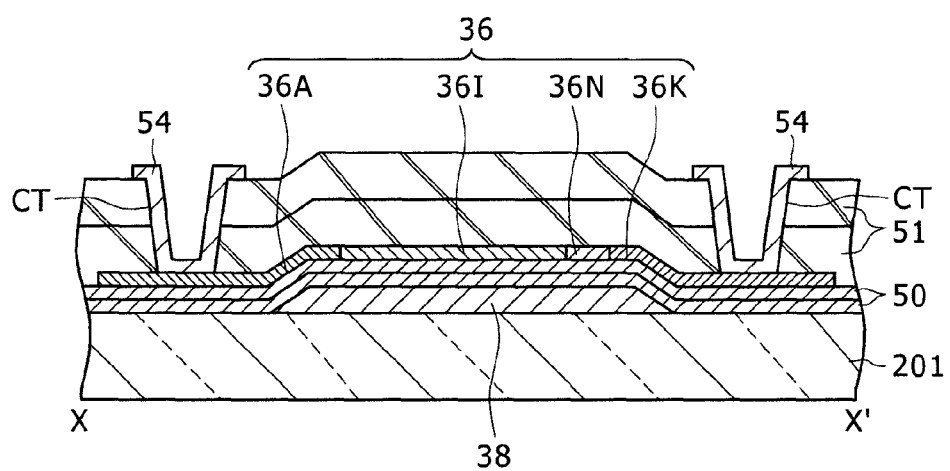
FIG. 23B is a sectional view taken along line X-X' of FIG. 23A.

FIG. 23A is a plan view of a thin film photodiode PD of the PIN structure in the present embodiment, and FIG. 23B is a sectional view taken along line X-X' of FIG. 23A. In FIG. 23B, wirings such as the VDD line 31 and the configuration of the second interlayer insulator film 52 and the upper layers are omitted. Excepting the configuration of the thin film photodiode PD, the display in the present embodiment has the same configuration as that in the first embodiment.

For example, a control gate 38 having a "metallic film" is formed on a TFT array substrate 201, gate insulator films 50 are formed on the upper side thereof, and a semiconductor layer 36 is formed on the further upper side.

The semiconductor layer 26 has a pattern shape as shown in FIG. 23A. Specifically, an anode region 36A having a P+ region (P-type semiconductor region), an I-region (intrinsic semiconductor region) 36I, a low-concentration semiconductor region (N− region) 36N, and a cathode region 36K having an N+ region (N-type semiconductor region) are laid out. A thin film photodiode of the PIN structure which has a low-concentration semiconductor region is thus configured.

In this layout, the width Wp of the anode region (P+ region) 36A in a direction perpendicular to the direction of connection to the cathode region (N+ region) 36K and the width Wn of the cathode region (N+ region) 36K in the direction perpendicular to the direction of connection to the anode region (P+ region) 36A are different from each other.

In addition, the layout of the control gate 38 in relation to these regions is as shown in FIG. 23A.

Besides, first insulator films 51 are formed so as to cover the photodiode, and is connected to contact plugs 54 through contact holes CT reaching the anode region (P+ region) 36A and the cathode region (N+ region) 36K.

Here, in the vicinity of that end part of the I-region 36I which is on the side of the anode region (P+ region) 36A, an I-region part 36IW having a width equivalent to the width Wp of the anode region (P+ region) 36A is provided.

In the present embodiment, like in the first embodiment, the area of an overlapping region of the anode region (P+ region) 36A and the control gate 38 as viewed from the one surface side or the other surface side and the area of an overlapping region of the cathode region (N+ region) 36K and the control gate 38 are different from each other. This results in a configuration in which the capacitance value of the parasitic capacitance Cgp is different from the capacitance value of the parasitic capacitance Cgn.

Consequently, a configuration is obtained in which the parasitic capacitance is reduced, i.e., the current storage capacitance is reduced, as compared with a thin film photodiode configured according to the related art.

Further, preferably, the control gate 38 is connected to that one of the anode region (P+ region) 36A and the cathode region (N+ region) 36K which is greater in the parasitic capacitance composed between itself and the control gate 38 opposed to each other through the gate insulator film 50 therebetween, i.e., to the greater one of the parasitic capacitances Cgp and Cgn. In the present embodiment, the control gate 38 is connected to the cathode region (N+ region) 36K.

This ensures that the greater one of the parasitic capacitances Cgp and Cgn can be made to be apparently absent, and the parasitic capacitance can be further reduced, i.e., the current storage capacitance can be further reduced.

According to the liquid crystal display including the photosensor parts each having the thin film photodiode pertaining to the present embodiment, the sensor signal sensitivity can be increased through reducing the current storage capacitance which is the parasitic capacitance, as above-mentioned.

Particularly, in the thin film photodiode according to the present embodiment, the area of overlap between the anode region (P+ region) 36A and the control gate 38 is narrowed, as compared with that in the thin film photodiode in the first embodiment, so that the parasitic capacitance Cgp is reduced more in the present embodiment than in the first embodiment.

In addition, since the interface between the I-region 36I and the anode region (P+ region) 36A is provided in the portion of the width Wp, there is the merit that the influences of errors in matching or alignment of interface positions in the fabrication steps are smaller than those in the first embodiment.

In the above configuration, variation in the width Wp of the anode region (P+ region) 36A may produce an influence on the sensitivity, and, therefore, it is important to design this factor with sufficient investigations.

In addition, with the I-region 36I provided with the portion having the width Wp, the loss due to recombination may become greater than that in the first embodiment. Where the loss is great, it is important to reduce the area of the I-region part 36IW and to make investigations in such a range as to produce little influence.

Fourth Embodiment

Figure 24A:
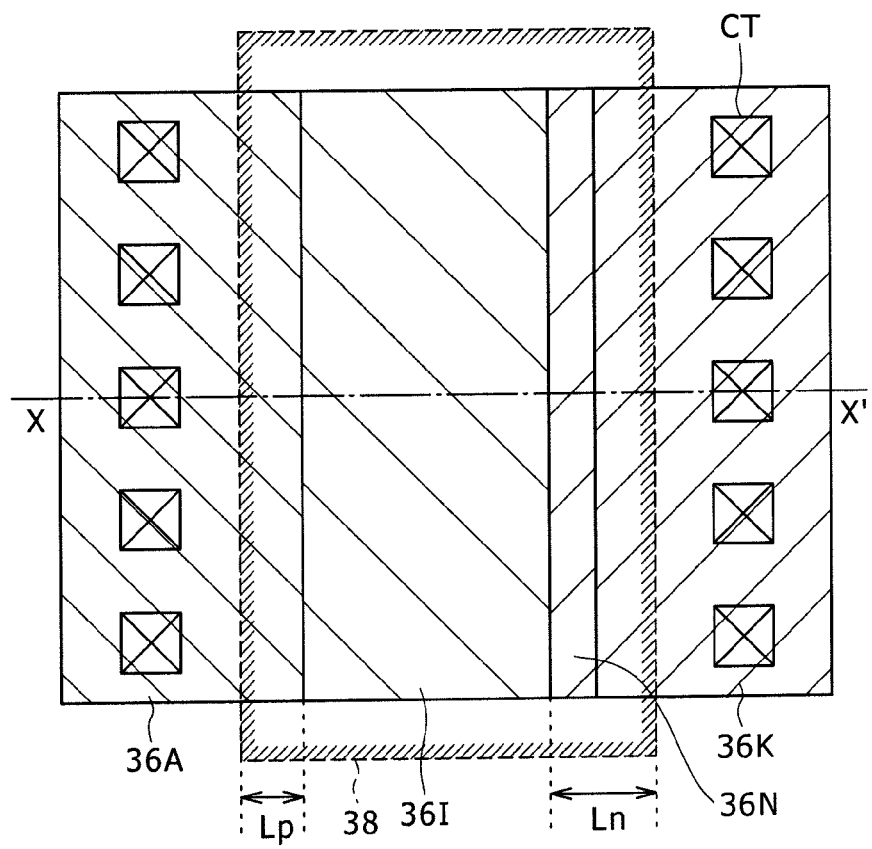
FIG. 24A is a plan view of a photodiode of a PIN structure provided in a liquid crystal display according to a fourth embodiment of the invention.
Figure 24B:
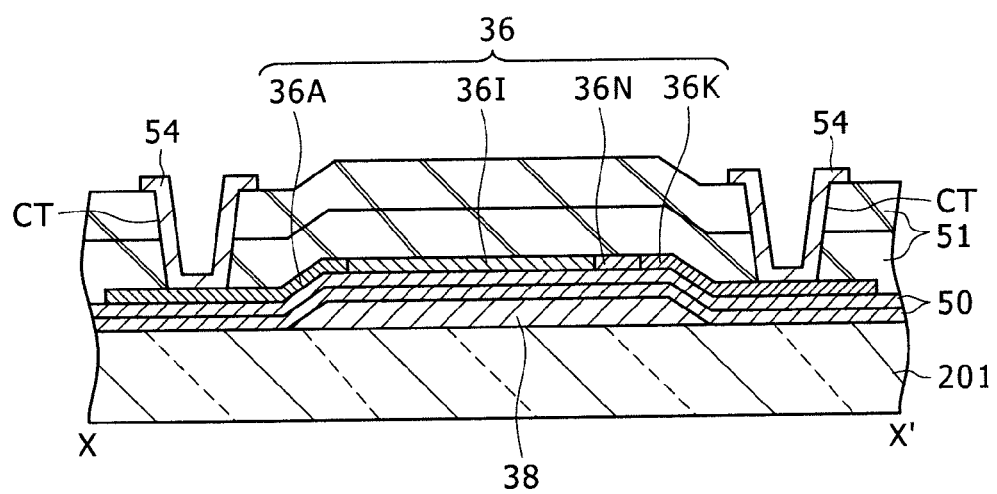
FIG. 24B is a sectional view taken along line X-X' of FIG. 24A.

FIG. 24A is a plan view of a thin film photodiode PD of the PIN structure in the present embodiment, and FIG. 24B is a sectional view taken along line X-X' of FIG. 24A. In FIG. 24B, wirings such as the VDD line 31 and the configuration of the second interlayer insulator film 52 and the upper layers are omitted. Excepting the configuration of the thin film photodiode PD, the display in the present embodiment has the same configuration as that in the first embodiment.

For example, a control gate 38 has a "metallic film" is formed on a TFT array substrate 201, two gate insulator films 50 are formed on the upper side thereof, and a semiconductor layer 36 is formed on the further upper side.

The semiconductor layer 36 has a pattern shape as shown in FIG. 24A. Specifically, an anode region 36A having a P+ region (P-type semiconductor region), an I-region (intrinsic semiconductor region) 36I, a low-concentration semiconductor region (N− region) 36N, and a cathode region 36K having an N+ region (N-type semiconductor region) are laid out, respectively. A thin film photodiode of the PIN structure which has a low-concentration semiconductor region is thus configured.

In addition, first interlayer insulator films 51 are formed so as to cover the photodiode, and are connected to contact plugs 54 through contact holes CT reaching the anode region (P+ region) 36A and the cathode region (N+ region) 36K.

Here, the width Lp of overlap between the anode region (P+ region) 36A and the control gate 38 as viewed from the one surface side or the other surface side is set to be smaller than the width Ln of overlap between the cathode region (N+ region) 36K and the control gate 38.

This, like in the first embodiment, results in a configuration in that the area of an overlapping region of the anode region (P+ region) 36A and the control gate 38 as viewed from the one surface side or the other surface side and the area of an overlapping region of the cathode region (N+ region) 36K and the control gate 38 are different from each other. As a result, the capacitance value of the parasitic capacitance Cgp is different from the capacitance value of the parasitic capacitance Cgn.

Consequently, a configuration is obtained in which the parasitic capacity is reduced, i.e., the current storage capacitance is reduced, as compared with a thin film photodiode configured according to the related art.

Further, preferably, the control gate 38 is connected to that one of the anode region (P+ region) 36A and the cathode region (N+ region) 36K which is greater in the parasitic capacitance composed between itself and the control gate 38 through the gate insulator film 50 therebetween. In short, the control gate 38 is preferably connected to the greater one of the above-mentioned parasitic capacitances Cgp and Cgn. In the present embodiment, the control gate 38 is connected to the cathode region (N+ region) 36K.

This ensures that the greater one of the parasitic capacitances Cgp and Cgn can be made to be apparently absent, and the parasitic capacitance can be further reduced, i.e., the current storage capacitance can be further reduced.

According to the liquid crystal display including the photosensor parts each having the thin film photodiode pertaining to the present embodiment, the sensor signal sensitivity can be increased through reducing the current storage capacitance which is the parasitic capacitance, as above-mentioned.

Particularly, the thin film photodiode according to the present embodiment has the merit that the loss due to recombination is smaller than that in the first embodiment.

The influence of variation in the width Wp of the anode region (P+ region) 36A on the sensitivity is also smaller than that in the first embodiment.

In addition, since the interface between the I-region 36I and the anode region (P+ region) 36A is provided in the portion of the width Wp, there is the merit that the influences of errors in matching or alignment of interface positions in the fabrication steps are smaller than those in the first embodiment.

Example 9

Based on the configuration of the thin film photodiode of the display according to the fourth embodiment in which the width Wn of the cathode region (N+ region) 36K and the width Wp of the anode region (P+ region) 36A are equal to each other, thin film photodiodes were fabricated by varying the width (W-length). Here, the width Lp of overlap between the anode region (P+ region) 36A and the control gate 38 and the width Ln of overlap between the cathode region (N+ region) 36K and the control gate 38 were set to be 0.5 μm and 1.5 μm, respectively.

Using the thin film photodiodes, variations in the parasitic capacitance Cgp between the control gate 38 and the anode region (P+ region) 36A and in the parasitic capacitance Cgn between the control gate 38 and the cathode region (N+ region) 36K with varying W-length were measured.

Figure 25:
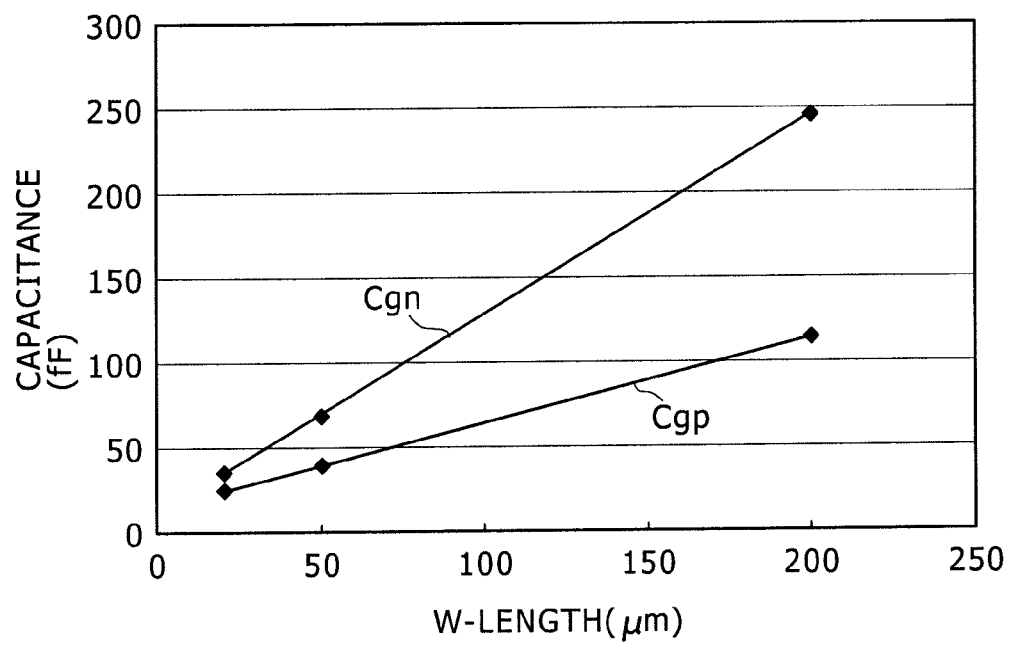
FIG. 25 is a graph showing the dependence of parasitic capacitances on W-length, according to Example 9.

The results are shown in FIG. 25.

As seen from the figure, both Cgp and Cgn increase as the W-length increases. However, Cgn is greater in inclination against the W-length, and Cgn is greater than Cgp by a larger amount as the W-length is greater.

Here, the connection between the control gate 38 and the cathode region (N+ region) 36K, as shown in the fourth embodiment, leads to the condition where only Cgp (which is the smaller one of the parasitic capacitances Cgp and Cgn) is present. This makes it possible to further reduce the parasitic capacitance, and to realize an increase in the sensor signal sensitivity through a reduction in the current storage capacitance.

Fifth Embodiment

Product Examples Obtained by Application of Display

The embodiments and the modified example thereof are applicable as character/image display parts in the following various products.

For example, they are applicable to television sets, monitors of personal computers and the like, mobile apparatuses having a video reproduction function such as mobile phones, game machines, PDA, etc., imaging apparatuses such as still cameras, video cameras, etc., in-vehicle apparatuses such as car navigation unit, and so on.

In addition, where infrared rays are used as the non-visible light, the distribution of body temperature of a person can be detected as a pattern of infrared rays. Therefore, the embodiment of the present invention is applicable to effective use of infrared rays in vein authentication of a human finger.

In this case, a vein authentication unit which includes a vein authentication panel capable of transmitting the light from the back light through the panel and which performs vein authentication based on the infrared rays emitted from the back light and reflected by a human finger touching the surface of the vein authentication panel, is provided in place of the liquid crystal panel 200.

First Application Example

Figure 26:
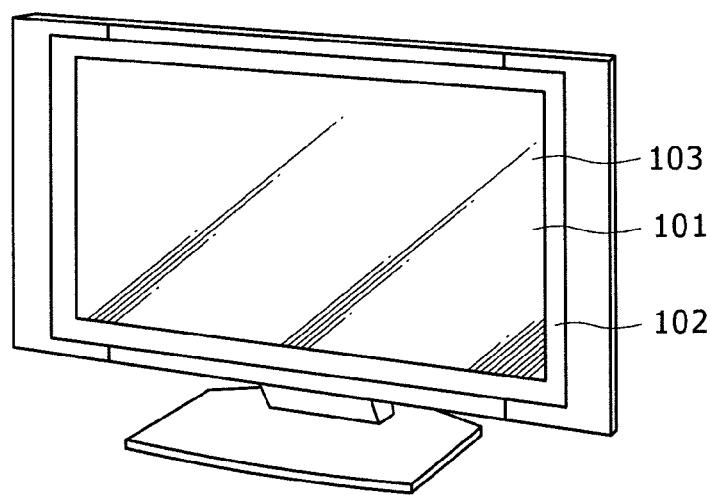
FIG. 26 is a perspective view of a television set as a first application example according to a fifth embodiment of the invention.

FIG. 26 is a perspective view of a television set as a first application example. The television set according to this application example includes a picture display screen section 101 having a front panel 102, a filter glass 103 and the like, and the above-described displays are applicable to the picture display screen section 101.

Second Application Example

Figure 27A:
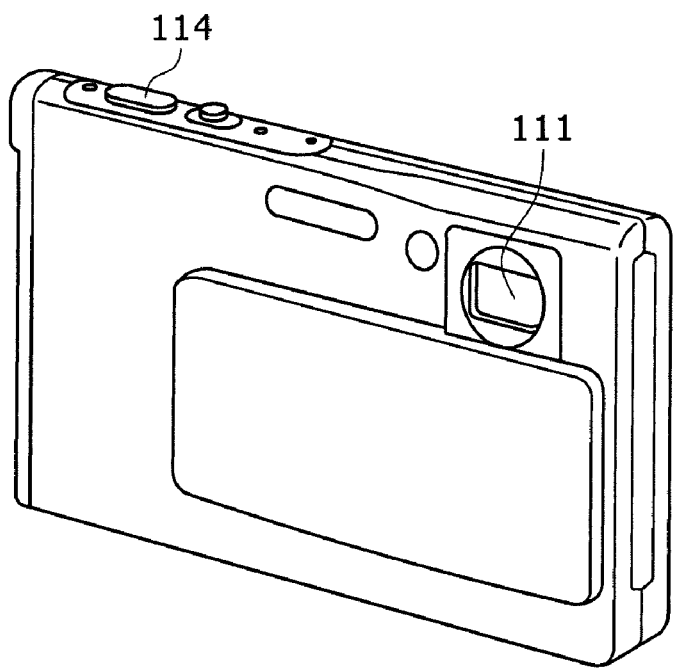
Figure 27B:
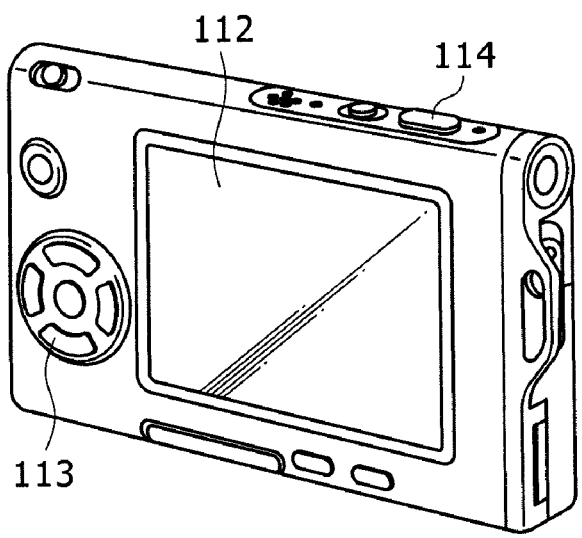

FIGS. 27A and 27B illustrate a digital camera as a second application example, wherein FIG. 27A is a perspective view from the face side, and FIG. 27B is a perspective view from the back side. The digital camera according to this application example includes a flash light emitting section 111, a display section 112, a menu switch 113, a shutter button 114, etc., and the above-described displays are applicable to the display section 112.

Third Application Example

Figure 28:
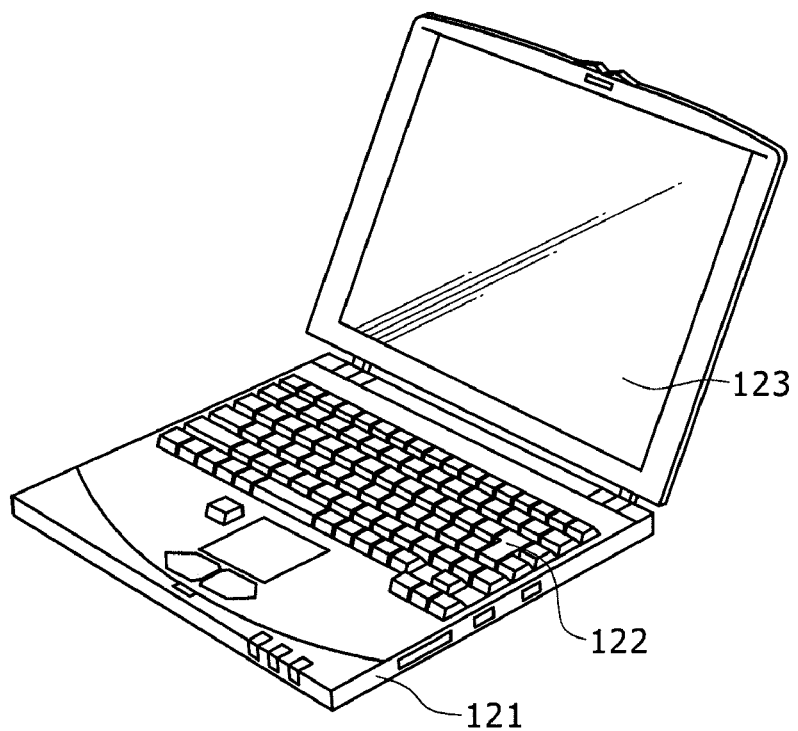
FIG. 28 is a perspective view of a notebook size personal computer as a third application example according to the fifth embodiment of the invention.

FIG. 28 is a perspective view of a notebook size personal computer as a third application example. The notebook size personal computer according to this application example has a main body 121 including a keyboard 122 operated at the time of inputting characters and the like, a display section 123 for displaying images, etc., and the above-described displays are applicable to the display section 123.

Fourth Application Example

Figure 29:
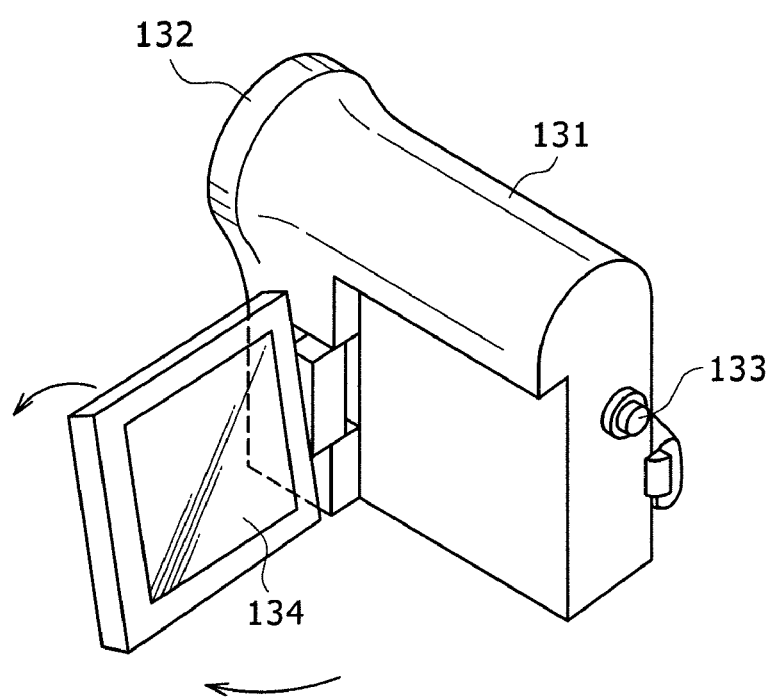
FIG. 29 is a perspective view of a video camera as a fourth application example according to the fifth embodiment of the invention.

FIG. 29 is a perspective view of a video camera as a fourth application example. The video camera according to this application example includes a main body section 131, a lens 132 for shooting an object, located at a side surface directed forwards, a start/stop switch 133 used at the time of shooting, a display section 134, etc., and the above-described displays are applicable to the display section 134.

Fifth Application Example

FIGS. 30A to 30G illustrate a mobile terminal apparatus, for example, a mobile phone as a fifth application example. In the figures, FIG. 30A is a front view of the mobile phone in an opened state, FIG. 30B is a side view of the same, FIG. 30C is a front view of the mobile phone in a closed state, FIG. 30D is a left side view of the same, FIG. 30E is a right side view of the same, FIG. 30F is a top view of the same, and FIG. 30G is a bottom view of the same. The mobile phone according to this application example includes an upper casing 141, a lower casing 142, a connecting section (here, a hinge section) 143, a display 144, a sub-display 145, a picture light 146, a camera 147, etc., and the above-described displays are applicable to the display 144 and the sub-display 145.

The displays according to the embodiments of the present invention are not limited to those described above.

For example, the control gate is connected to the side of the cathode region ($N^+$ region) 36K and the width of the anode region ($P^+$ region) 36A is set to be smaller than that of the cathode region ($N^+$ region) 36K in the above embodiments, such a configuration is not limitative. For instance, a configuration is possible in which the control gate is connected to the side of the anode region ($P^+$ region) 36A, and the width of the cathode region ($N^+$ region) 36K is set to be smaller than that of the anode region ($P^+$ region) 36A.

In this case, the ratio R2 of the width Wn of the cathode region ($N^+$ region) 36K to the width Wp of the anode region ($P^+$ region) 36A in the thin film photodiode PD is preferably in the range of $0.3 \leq R2 < 1$, for the same reason as above-mentioned.

Besides, the distance between that end part of the cathode region ($N^+$ region) 36K which is on the side of the anode region ($P^+$ region) 36A and that end part of the control gate 38 which is on the side of the cathode region ($N^+$ region) 36K is preferably in the range of 1.5 to 3.0 µm, for the same reason as above-mentioned.

In addition, while description has been made of the liquid crystal display in the above embodiments, this is not limitative, and the displays according to the embodiments of the present invention are applicable also to other displays such as organic EL displays and displays based on E-paper.

Other than the above-mentioned, various modifications are possible without departing from the scope or gist of the present invention.

What is claimed is:
1. A display comprising:
   a substrate having
      a pixel region at which pixels are formed and
      a sensor region at which photo-sensor parts are formed;
   an illuminating section configured to illuminate said substrate from one surface side of said substrate;
   a thin film photodiode disposed at said sensor region, having at least
      a p type semiconductor region and
      a n type semiconductor region, and
   configured to receive light incident from the other surface side of said substrate; and
      a metallic film covering said thin film photodiode with an insulator film therebetween, configured to restrain light generated from said illuminating section from being directly incident on said thin film photodiode from said one surface side, and being fixed to a predetermined potential, wherein, a width of said p type semiconductor region of said thin film photodiode in a direction perpendicular to a direction of connection to said n type semiconductor region and a width of said n type semiconductor region in a direction perpendicular to a direction of connection to said p type semiconductor region are different from each other.

2. The display as set forth in claim 1, wherein in said thin film photodiode, the area of an overlapping region of said p type semiconductor region and said metallic film as viewed from one of said one surface side and said other surface side is different from the area of an overlapping region of said n type semiconductor region and said metallic film.

3. The display as set forth in claim 1,
wherein said metallic film is connected to said n type semiconductor region, and
in said thin film photodiode, the width of said p type semiconductor region in a direction perpendicular to the direction of connection to said n type semiconductor region is smaller than the width of said n type semiconductor region in the direction perpendicular to the direction of connection to said p type semiconductor region.

4. The display as set forth in claim 3,
wherein in said thin film photodiode, the area of an overlapping region of said p type semiconductor region and said metallic film as viewed from one of said one surface side and said other surface side is smaller than the area of an overlapping region of said negative type semiconductor region and said metallic film.

5. The display as set forth in claim 3,
wherein in said thin film photodiode, the ratio R1 of said width of said p type semiconductor region to said width of said n type semiconductor region is in the range of $0.3 \leq R1 < 1$.

6. The display as set forth in claim 1,
wherein said metallic film is connected to said p type semiconductor region, and
in said thin film photodiode, the width of said p type semiconductor region in a direction perpendicular to the direction of connection to said n type semiconductor region is larger than the width of said n type semiconductor region in the direction perpendicular to the direction of connection to said p type semiconductor region.

7. The display as set forth in claim 6,
wherein in said thin film photodiode, the area of an overlapping region of said p type semiconductor region and said metallic film as viewed from one of said one surface side and said other surface side is larger than the area of an overlapping region of said n type semiconductor region and said metallic film.

8. The display as set forth in claim 6,
wherein in said thin film photodiode, the ratio R2 of said width of said n type semiconductor region to said width of said p type semiconductor region is in the range of $0.3 \leq R2 < 1$.

9. The display as set forth in claim 1,
wherein said thin film photodiode has, between said n type semiconductor region and said p type semiconductor region, an intrinsic semiconductor region and/or a low-concentration semiconductor region which has a conductive impurity concentration lower than those of said n type semiconductor region and said p type semiconductor region.

10. The display as set forth in claim 1,
wherein a semiconductor region including said p type semiconductor region and said n type semiconductor region constituting said thin film photodiode is formed from a polycrystalline silicon, microcrystalline silicon, amorphous silicon or crystalline silicon.

11. The display as set forth in claim 1,
wherein said illuminating section emits non-visible light, and
said thin film photodiode has sensitivity to said non-visible light.

12. The display as set forth in claim 1,
wherein the distance between an end part of said p type semiconductor region on the n type semiconductor region side and an end part of said metallic film on the p type semiconductor region side is in the range of 1.5 to 3.0 μm.

13. The display as set forth in claim 1,
wherein the distance between an end part of said n type semiconductor region on the p type semiconductor region side and an end part of said metallic film on the n type semiconductor region side is in the range of 1.5 to 3.0 μm.

14. A display comprising:
a substrate having
a pixel region at which pixels are formed and
a sensor region at which photo-sensor parts are formed;
an illuminating section configured to illuminate said substrate from one surface side of said substrate;
a thin film photodiode disposed at said sensor region, having at least
a p type semiconductor region and
a n type semiconductor region, and
configured to receive light incident from the other surface side of said substrate; and
a metallic film covering said thin film photodiode with an insulator film therebetween, configured to restrain light generated from said illuminating section from being directly incident on said thin film photodiode from said one surface side, and being fixed to a predetermined potential,
wherein in said thin film photodiode and said metallic film, the capacitance value of a parasitic capacitor formed by said p type semiconductor region and said metallic film with said insulator film therebetween is different from the capacitance value of a parasitic capacitor formed by said n type semiconductor region and said metallic film with said insulator film therebetween.

15. A display comprising:
a substrate having
a pixel region at which pixels are formed and
a sensor region at which photo-sensor parts are formed;
an illuminating section configured to illuminate said substrate from one surface side of said substrate;
a thin film photodiode disposed at said sensor region, having at least
a p type semiconductor region and
a n type semiconductor region, and
configured to receive light incident from the other surface side of said substrate; and
a metallic film covering said thin film photodiode with an insulator film therebetween, configured to restrain light generated from said illuminating section from being directly incident on said thin film photodiode from said one surface side, and being fixed to a predetermined potential, wherein in said thin film photodiode, the area of an overlapping region of said p type semiconductor region and said metallic film as viewed from one of said one surface side and said other surface side is different from the area of an overlapping region of said n type semiconductor region and said metallic film.

16. The display as set forth in claim 14,
wherein said metallic film is connected to that one of said p type semiconductor region and said n type semiconductor region which is higher in capacitance value of a parasitic capacitance including said p type or n type semiconductor region itself and said metallic film facing each other through said insulator film therebetween.

17. The display as set forth in claim 15,
wherein in said thin film photodiode, the width of said p type semiconductor region in a direction perpendicular to the direction of connection to said n type semiconductor region is different from the width of said n type semiconductor region in the direction perpendicular to the direction of connection to said p type semiconductor region.

18. The display as set forth in claim 16,
wherein said metallic film is connected to said n type semiconductor region, and
in said thin film photodiode, the width of said p type semiconductor region in a direction perpendicular to the direction of connection to said n type semiconductor region is larger than the width of said n type semiconductor region in the direction perpendicular to the direction of connection to said p type semiconductor region.

19. The display as set forth in claim 15,
wherein said metallic film is connected to said p type semiconductor region, and
in said thin film photodiode, the width of said p type semiconductor region in a direction perpendicular to the direction of connection to said n type semiconductor region is smaller than the width of said n type semiconductor region in the direction perpendicular to the direction of connection to said p type semiconductor region.

20. The display as set forth in claim 15,
wherein said thin film photodiode has, between said n type semiconductor region and said p type semiconductor region, an intrinsic semiconductor region and/or a low concentration semiconductor region which has a conductive impurity concentration lower than those of said n type semiconductor region and said p type semiconductor region.

* * * * *